(12) United States Patent
Matsuura et al.

(10) Patent No.: US 9,841,677 B2
(45) Date of Patent: Dec. 12, 2017

(54) NEGATIVE PHOTOSENSITIVE RESIN COMPOSITION, CURED RESIN FILM, PARTITION WALLS AND OPTICAL ELEMENT

(71) Applicant: ASAHI GLASS COMPANY, LIMITED, Tokyo (JP)

(72) Inventors: Keigo Matsuura, Tokyo (JP); Masayuki Kawashima, Tokyo (JP); Hideyuki Takahashi, Tokyo (JP); Daisuke Kobayashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 151 days.

(21) Appl. No.: 14/702,929

(22) Filed: May 4, 2015

(65) Prior Publication Data

US 2015/0234273 A1    Aug. 20, 2015

Related U.S. Application Data

(63) Continuation of application No. PCT/JP2013/081965, filed on Nov. 27, 2013.

(30) Foreign Application Priority Data

Nov. 28, 2012 (JP) ................................. 2012-259964

(51) Int. Cl.
   *B32B 3/10*   (2006.01)
   *G03F 7/027*  (2006.01)
   (Continued)

(52) U.S. Cl.
   CPC ............ *G03F 7/0275* (2013.01); *G03F 7/031* (2013.01); *G03F 7/032* (2013.01); *G03F 7/0755* (2013.01); *Y10T 428/24802* (2015.01)

(58) Field of Classification Search
   None
   See application file for complete search history.

(56) References Cited

FOREIGN PATENT DOCUMENTS

| JP | 2007-304534 | 11/2007 |
| JP | 2008-298859 | 12/2008 |

(Continued)

OTHER PUBLICATIONS

Machine Translation of JP2009-053445.*

(Continued)

*Primary Examiner* — Christopher Polley
(74) *Attorney, Agent, or Firm* — Oblon, McClelland, Maier & Neustadt, L.L.P.

(57) ABSTRACT

To provide a negative photosensitive resin composition which may be sufficiently cured even at a low exposure amount and which can impart good ink repellency to the upper surface of partition walls, a cured resin film and partition walls which have good ink repellency on the upper surface, and an optical element which has dots formed with good precision, having opening sections partitioned by partition walls uniformly coated with an ink.

A negative photosensitive resin composition comprising an alkali-soluble resin or alkali-soluble monomer (A) having an ethylenic double bond, a photopolymerization initiator (B), a thiol compound (C) having at least 3 mercapto groups in one molecule, and an ink repellent agent (D), a cured resin film and partition walls formed by using the negative photosensitive resin composition, and an optical element having the partition walls located between a plurality of dots and their adjacent dots on a substrate surface.

20 Claims, 4 Drawing Sheets

(51) Int. Cl.
*G03F 7/031* (2006.01)
*G03F 7/075* (2006.01)
*G03F 7/032* (2006.01)

(56) References Cited

FOREIGN PATENT DOCUMENTS

| | | |
|---|---|---|
| JP | 2009-053445 | 3/2009 |
| JP | 2009053445 A * | 3/2009 |
| JP | 2009-128518 A | 6/2009 |
| JP | 2010-237545 | 10/2010 |
| JP | 2011-064749 A | 3/2011 |
| JP | 2011-099918 A | 5/2011 |
| JP | 2011-237736 A | 11/2011 |
| JP | 2013-095796 A | 5/2013 |
| WO | WO 2008/146855 A1 | 12/2008 |
| WO | WO 2010/013816 A1 | 2/2010 |
| WO | WO 2010/134550 A1 | 11/2010 |
| WO | WO 2012/147626 A1 | 11/2012 |

OTHER PUBLICATIONS

U.S. Appl. No. 14/688,366, filed Apr. 16, 2015, Matsuura, et al.
International Search Report dated Jan. 14, 2014 in PCT/JP2013/081965 filed Nov. 27, 2013.

* cited by examiner

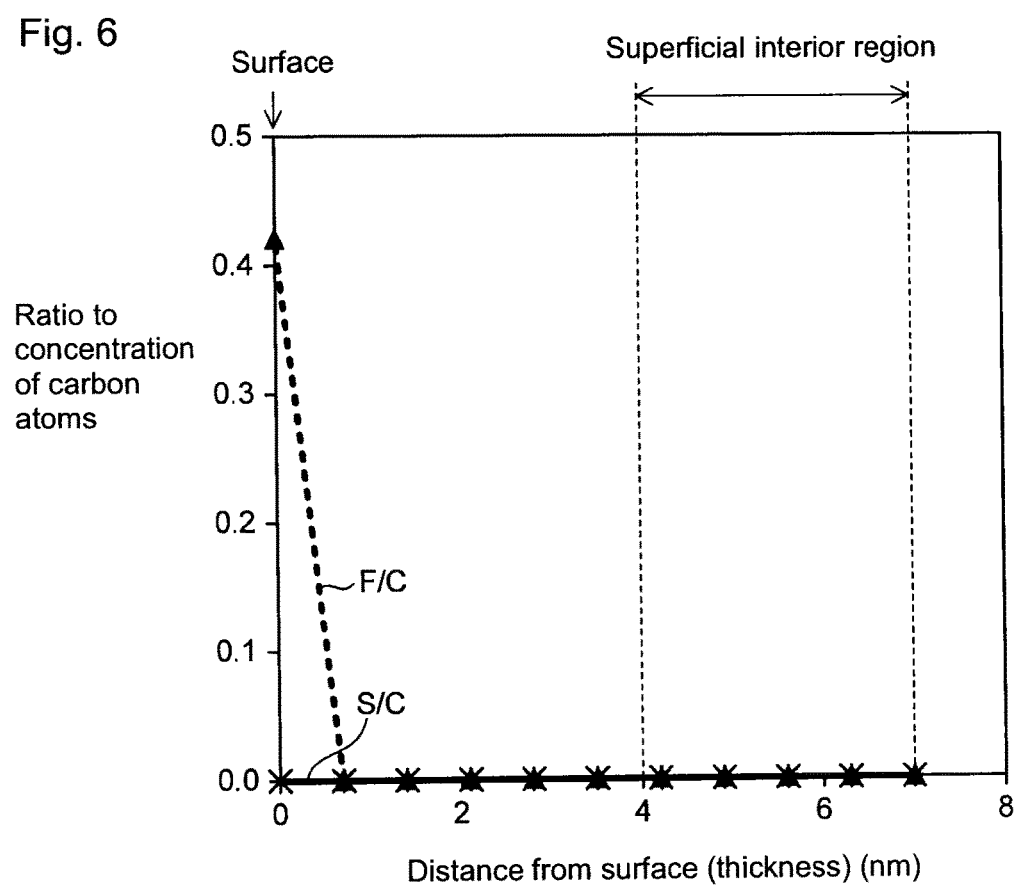

NEGATIVE PHOTOSENSITIVE RESIN COMPOSITION, CURED RESIN FILM, PARTITION WALLS AND OPTICAL ELEMENT

TECHNICAL FIELD

The present invention relates to a negative photosensitive resin composition, a cured resin film, partition walls and an optical element.

BACKGROUND ART

In the production of an optical element such as an organic EL (Electro-Luminescence) element, a method of pattern printing an organic layer such as a luminescent layer in the form of dots by an ink jet (IJ) method, may be employed. In such a method, partition walls are formed along the profiles of dots to be formed, and an ink containing the material for an organic layer is injected into compartments (hereinafter referred to also as opening sections) defined by the partition walls, followed by e.g. drying and/or heating, to form dots in a desired pattern.

In the above method, in order to prevent mixing of the ink between the adjacent dots and in order to uniformly apply the ink in forming the dots, the upper surface of the partition walls is required to have ink repellency, while the opening sections for forming dots as defined by the partition walls including the side surfaces of the partition walls are required to have ink-philicity.

Thus, in order to obtain partition walls having ink repellency on the upper surface, a method has been known to form partition walls corresponding to the pattern of dots by photolithography employing a photosensitive composition containing an ink repellent agent. For example, Patent Document 1 discloses a negative photosensitive resin composition containing a silicone-based ink repellent agent comprising a hydrolyzed condensate of a fluorinated hydrolysable silane compound.

Further, in production of partition walls by photolithography employing a photosensitive resin composition, with a view to improving the productivity, it is necessary to carry out curing of the photosensitive resin composition at a low exposure amount. Particularly if curing of a layer having ink repellency to be formed on the upper surface of the partition walls is insufficient, the layer may be eluted at the time of development and become extremely thin, or the layer itself may disappear in some case, and thus it is important to sufficiently cure such a layer. For example, Patent Document 2 discloses a photosensitive composition employing a specific photopolymerization initiator. As a sensitizer, a monofunctional or bifunctional thiol compound is disclosed.

PRIOR ART DOCUMENTS

Patent Documents

Patent Document 1: WO2010/013816
Patent Document 2: WO2008/146855

DISCLOSURE OF INVENTION

Technical Problem

In recent years, in order to obtain higher productivity, development of a photosensitive resin composition which may be sufficiently cured even at a lower exposure amount than the exposure conditions as disclosed in Patent Document 2 and which can impart ink repellency to the upper surface of partition walls.

The object of the present invention is to provide a negative photosensitive resin composition which may be sufficiently cured even at a low exposure amount and which can impart good ink repellency to the upper surface of partition walls, and a cured resin film and partition walls having good ink repellency on the upper surface, obtained by using such a composition.

Another object of the present invention is to provide an optical element having dots which are formed with good precision, having opening sections partitioned by partition walls uniformly coated with an ink.

Solution to Problem

The present invention provides a cured resin film, a negative photosensitive resin composition, partition walls and an optical element, having the following constructions [1] to [16].

[1] A cured resin film formed on a substrate and characterized in that in a composition analysis in the thickness direction of the cured resin film by X-ray photoelectron spectroscopy (XPS) using Ar sputtering ions, the ratio of the concentration of fluorine atoms to the concentration of carbon atoms at the surface of the cured resin film i.e. $[F/C]_{(i)}$, is from 0.100 to 3.000, and the $[F/C]_{(i)}$ is higher than the average ratio of the concentration of fluorine atoms to the concentration of carbon atoms in a superficial interior region beginning at a position of thickness of 4 nm from the surface of the cured resin film and extending to a position of thickness of 7 nm from the surface i.e. $[F/C]_{(ii)}$, and the ratio of the concentration of sulfur atoms to the concentration of carbon atoms at the surface of the cured resin film i.e. $[S/C]_{(i)}$ and the average ratio of the concentration of sulfur atoms to the concentration of carbon atoms in the above superficial interior region of the cured resin film i.e. $[S/C]_{(ii)}$ are from 0.001 to 0.050.

[2] A negative photosensitive resin composition comprising an alkali-soluble resin or alkali-soluble monomer (A) having an ethylenic double bond, a photopolymerization initiator (B), a thiol compound (C) having at least 3 mercapto groups in one molecule, and an ink repellent agent (D).

[3] The negative photosensitive resin composition according to the above [2], which contains from 5 to 80 mass % of the alkali-soluble resin or alkali-soluble monomer (A) having an ethylenic double bond, from 0.1 to 50 mass % of the photopolymerization initiator (B) and from 0.01 to 15 mass % of the ink repellent agent (D) in the total solid content in the negative photosensitive resin composition.

[4] The negative photosensitive resin composition according to the above [2] or [3], which contains the thiol compound (C) so that the amount of the mercapto groups in the thiol compound (C) is from 0.0001 to 1 mol per 1 mol of the ethylenic double bond in the total solid content in the negative photosensitive resin composition.

[5] The negative photosensitive resin composition according to any one of the above [2] to [4], wherein the ink repellent agent (D) has fluorine atoms, and the content of fluorine atoms in the ink repellent agent (D) is from 1 to 40 mass %.

[6] The negative photosensitive resin composition according to any one of the above [2] to [5], wherein the ink repellent agent (D) is a compound having an ethylenic double bond.

[7] The negative photosensitive resin composition according to any one of the above [2] to [6], wherein the ink repellent agent (D) is a partially hydrolyzed condensate of a hydrolysable silane compound.

[8] The negative photosensitive resin composition according to the above [7], wherein the partially hydrolyzed condensate is a partially hydrolyzed condensate of a hydrolysable silane compound mixture containing a hydrolysable silane compound (s1) having a fluoroalkylene group and/or a fluoroalkyl group and a hydrolysable group.

[9] The negative photosensitive resin composition according to the above [8], wherein the hydrolysable silane compound mixture further contains a hydrolysable silane compound (s2) having 4 hydrolysable groups bonded to the silicon atom.

[10] The negative photosensitive resin composition according to the above [9], wherein the hydrolysable silane compound mixture further contains a hydrolysable silane compound (s3) having a group with an ethylenic double bond and a hydrolysable group and having no fluorine atom.

[11] The negative photosensitive resin composition according to any one of the above [2] to [10], which further contains a cross-linking agent (E) having at least 2 ethylenic double bonds in one molecule and having no acidic group.

[12] The negative photosensitive resin composition according to any one of the above [2] to [11], which further contains a solvent (F).

[13] A cured resin film formed by using the negative photosensitive resin composition as defined in any one of the above [2] to [12].

[14] The cured resin film according to the above [13] formed on a substrate and characterized in that in a composition analysis in the thickness direction of the cured resin film by X-ray photoelectron spectroscopy (XPS) using Ar sputtering ions, the ratio of the concentration of fluorine atoms to the concentration of carbon atoms at the surface of the cured resin film i.e. $[F/C]_{(i)}$ is from 0.100 to 3.000, and the $[F/C]_{(i)}$ is higher than the average ratio of the concentration of fluorine atoms to the concentration of carbon atoms in a superficial interior region beginning at a position of thickness of 4 nm from the surface of the cured resin film and extending to a position of thickness of 7 nm from the surface i.e. $[F/C]_{(ii)}$, and the ratio of the concentration of sulfur atoms to the concentration of carbon atoms at the surface of the cured resin film i.e. $[S/C]_{(i)}$ and the average ratio of the concentration of sulfur atoms to the concentration of carbon atoms in the above superficial interior region of the cured resin film i.e. $[S/C]_{(ii)}$ are from 0.001 to 0.050.

[15] Partition walls formed to partition a substrate surface into a plurality of compartments for forming dots, which are made of the cured resin film as defined in the above [1], [13] or [14].

[16] An optical element having partition walls located between a plurality of dots and their adjacent dots on a substrate surface, wherein the partition walls are formed of the partition walls as defined in the above [15].

[17] The optical element according to the above [16], wherein the dots are formed by an ink jet method.

Advantageous Effects of Invention

According to the present invention, it is possible to provide a negative photosensitive resin composition which may be sufficiently cured even at a low exposure amount and which can impart good ink repellency to the upper surface of partition walls.

The cured resin film and the partition walls of the present invention have good ink repellency on the upper surface.

The optical element of the present invention is an optical element having dots which are formed with good precision, having opening sections partitioned by partition walls uniformly coated with an ink.

BRIEF DESCRIPTION OF DRAWINGS

FIG. 6 is a chart showing the ratios of the concentration of fluorine atoms and the concentration of sulfur atoms to the concentration of carbon atoms in the thickness direction, obtained from the results of analysis of FIG. 5

DESCRIPTION OF EMBODIMENTS

Figure 1:
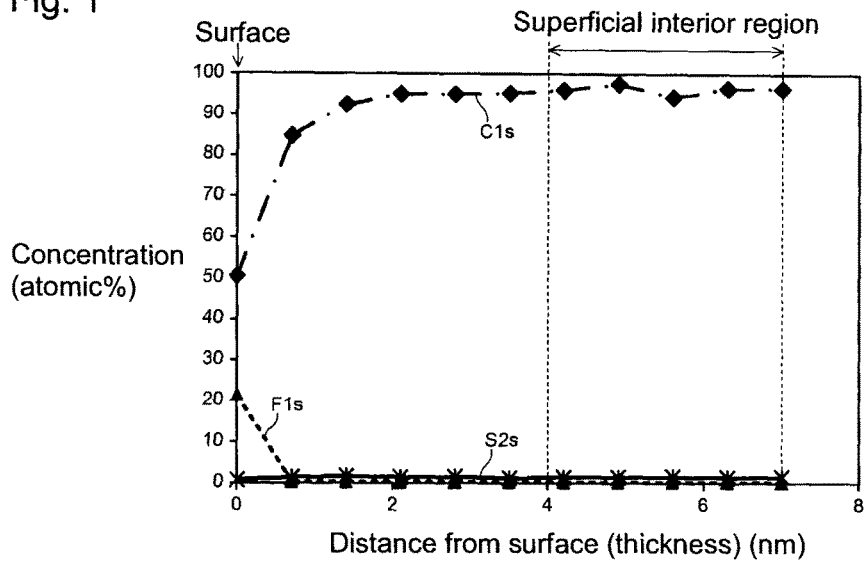
FIG. 1 is a chart showing the results of a composition analysis in the thickness direction of a superficial layer including the surface, by XPS, of a cured resin film in an Example of the present invention.

In this specification, a "(meth)acryloyl group" is a general term for a "methacryloyl group" and an "acryloyl group". The same applies to a (meth)acryloyloxy group, (meth)acrylic acid, a (meth)acrylate, a (meth)acrylamide and a (meth)acrylic resin.

In this specification, a group represented by the formula (x) may sometimes be referred to simply as a group (x).

In this specification, a compound represented by the formula (y) may sometimes be referred to simply as a compound (y).

Here, the formula (x) and the formula (y) are formulae mentioned as optional examples.

In this specification, a "side chain" is a group other than a hydrogen or halogen atom, bonded to a carbon atom constituting a main chain in a polymer wherein repeating units constitute the main chain.

In this specification, "the total solid content in the photosensitive resin composition" is meant for components to form a cured resin film described later, among components contained in the photosensitive resin composition and is obtained from a residue remaining after heating the photosensitive resin composition at 140° C. for 24 hours to remove any solvent. Here, the total solid content amount may also be calculated from the charged amounts.

In this specification, a film made of a cured product of a composition containing a resin as the main component, is referred to as a "cured resin film".

In this specification, a film formed by coating with a photosensitive resin composition is referred to as a "coating film" and a film formed by drying it, is referred to as a "dried film". A film obtainable by curing such a "dried film" is a "cured resin film". Further, in this specification, a "cured resin film" may sometimes be referred to simply as a "cured film".

The cured resin film may be in the form of partition walls formed to partition a prescribed region into a plurality of compartments. Into the compartments partitioned by the partition walls i.e. opening sections surrounded by the partition walls, for example, the following "ink" is injected to form "dots".

In this specification, an "ink" is a general term for a liquid having optical and/or electrical functions after being dried, cured, etc.

In optical elements such as an organic EL element, a color filter for liquid crystal element and an organic TFT (Thin Film Transistor) array, dots as various constituent elements may be pattern-printed by an ink jet (IJ) method using inks to form such dots. The "ink" in this specification includes inks to be used in such applications.

In this specification, "ink repellency" is a nature to repel such an ink and has both water repellency and oil repellency. The ink repellency may be evaluated, for example, by a contact angle when an ink is dropped. Whereas, "ink-philicity" is a nature opposite to ink repellency and may be evaluated by a contact angle when an ink is dropped, in the same manner as in the case of ink repellency. Otherwise, ink-philicity may be evaluated by evaluating, by prescribed standards, the degree of wet spreading of ink (wet spreadability of ink) when the ink is dropped.

In this specification, a "dot" represents an optically modulatable minimum region in an optical element. In optical elements such as an organic EL element, a color filter for liquid crystal element and an organic TFT array, in the case of black and white presentation, 1 dot=1 pixel, and in the case of colored presentation, e.g. 3 dots (R (red), G (green) and B (blue))=1 pixel.

Now, embodiments of the present invention will be described. In this specification, % represents mass % unless otherwise specified.

Cured Resin Film According to a First Embodiment

The cured resin film according to a first embodiment of the present invention is a cured resin film formed on a substrate and having the following characteristics (I) and (II) in a composition analysis in the thickness direction of a superficial layer including the surface of the cured resin film, by XPS (x-ray photoelectron spectroscopy) using Ar sputtering ions.

(I) The ratio of the concentration of fluorine atoms to the concentration of carbon atoms at the surface of the cured resin film i.e. $[F/C]_{(i)}$ is from 0.100 to 3.000, and the $[F/C]_{(i)}$ is higher than the average ratio of the concentration of fluorine atoms to the concentration of carbon atoms in a superficial interior region beginning at a position of thickness of 4 nm from the surface of the cured resin film and extending to a position of thickness of 7 nm from the surface (hereinafter sometimes referred to simply as "superficial interior region" i.e. $[F/C]_{(ii)}$.

(II) The ratio of the concentration of sulfur atoms to the concentration of carbon atoms at the surface of the cured resin film i.e. $[S/C]_{(i)}$ and the average ratio of the concentration of sulfur atoms to the concentration of carbon atoms in the above superficial interior region of the cured resin film i.e. $[S/C]_{(ii)}$ are from 0.001 to 0.050.

In this specification, the "surface" of a cured resin film is the main surface on the side opposite to the substrate side of the cured resin film. In this specification, the "upper surface" of partition walls or a cured resin film has the same meaning as such a surface.

So long as the cured resin film of the present invention has the above characteristic (I) as the ratio of the concentration of fluorine atoms to the concentration of carbon atoms and the above characteristic (II) as the ratio of the concentration of sulfur atoms to the concentration of carbon atoms in the surface and superficial interior region in a composition analysis in the thickness direction by XPS, the film thickness is not particularly limited. The film thickness of the cured resin film may suitably be selected depending upon the particular application, and is preferably from 0.05 to 50 μm, particularly preferably from 0.2 to 10 μm.

Here, the composition analysis in the thickness direction of the superficial layer including the surface of the cured resin film by XPS using Ar sputtering ions will be described with reference to a specific example. However, the cured resin film of the present invention is by no means restricted thereto. A conventional method in a compositional analysis by XPS with respect to the surface to the vicinity of the surface of a cured resin film may be applicable without any particular restriction.

Figure 2:
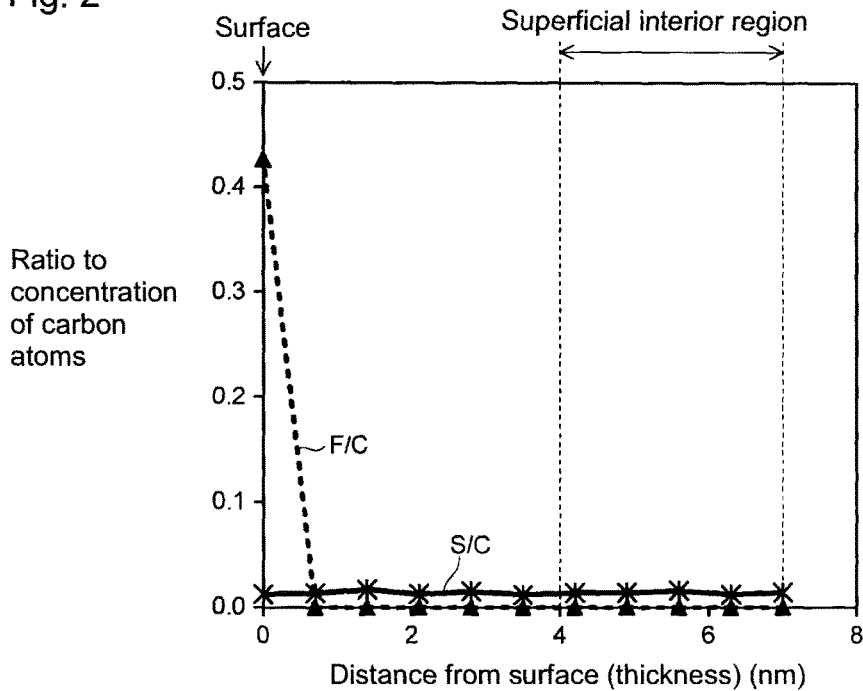
FIG. 2 is a chart showing the ratios of the concentration of fluorine atoms and the concentration of sulfur atoms to the concentration of carbon atoms in the thickness direction, obtained from the results of analysis of FIG. 1.

FIG. 1 shows the results of a composition analysis in the thickness direction of the superficial layer including the surface by XPS, in an example of the cured resin film of the present invention. Further, FIG. 2 shows the ratio of the concentration of fluorine atoms and the concentration of sulfur atoms to the concentration of carbon atoms in the thickness direction obtained from the analytical results of FIG. 1.

FIG. 1 shows the results of analysis in the thickness direction of the superficial layer including the surface of partition walls comprising the cured resin film obtained in Ex. 16 as an Example of the present invention described hereinafter, by XPS using as an apparatus for example Quantera-SXM manufactured by ULVAC-PHI, Inc. using Ar sputtering ions. The analytical conditions are as follows.

(Analytical Conditions)
X-ray source: Al Kα
X-ray beam size: about 20 μm in diameter
Measurement area: about 20 μm in diameter
Detection angle: 45° from the sample surface
Sputtering ions: Ar
Accelerating voltage for sputtering ions: 1 kV
Raster size of sputtering ions: 3×3 mm$^2$
Measured peaks: F1s, C1s, S2s
No. of Sweeps: 3(F1s), 3(C1s), 32(S2s)
Pass Energy: 224 eV
Step Size: 0.4 eV
Ratio: 2(F1s), 2(C1s), 2(S2s)
Analytical software: MultiPak In the above XPS analysis, in a case where the width of the cured resin film is narrower than the beam size (about 20

μm in diameter), the composition analysis of the surface of the cured resin film is possible by further narrowing the beam size.

The abscissa of the profile in the thickness direction of the cured resin film obtainable by the above XPS analysis is usually given as the sputtering time. As a method for converting the sputtering time to the distance (thickness) from the surface as shown on the abscissa in FIG. 1 and FIG. 2, for example, a method of obtaining data on the sputtering etching rate (the rate of sputtering) employing a thermally oxidized film ($SiO_2$ film) on a Si wafer as a standard and converting the data to a distance from the surface, may be mentioned. For analysis of partition walls in Ex. 16 as an Example of the present invention, a thermally oxidized film ($SiO_2$ film) on a Si wafer having a known film thickness was used, the sputtering rate of the $SiO_2$ film under the above XPS analytical conditions was measured to be 0.7 nm/min, and at the sputtering rate, the sputtering time was converted to the distance (thickness) from the surface.

In FIG. 1, the abscissa represents the distance (thickness) [nm] from the surface obtained by the above method, whereby the position of thickness "0" is the surface of the cured resin film, and the thickness of from 4 to 7 nm is the superficial interior region. The concentration of carbon atoms as the main constituent of the cured resin film is analyzed as C1s, and the analytical value is shown by an alternate long and short dash line in FIG. 1. The concentration of fluorine atoms in the cured resin film is analyzed as F1s, and the analytical value is shown by a dotted line in FIG. 1. The concentration of sulfur atoms in the cured resin film is analyzed as C2s, and the analytical value is shown by a solid line in FIG. 1. Here, the description with respect to the concentrations of other atoms such as oxygen and Si in the cured resin film is omitted.

Measured values (concentration of atoms) every one minute from the surface (sputtering time: 0 minute) to a sputtering time of 10 minutes of partition walls in Ex. 16 as an Example of the present invention obtained by the above XPS analysis are shown in Table 1. Further, in Table 1, the distance [nm] from the surface as calculated from the sputtering rate of the $SiO_2$ film is also shown. Further, the ratio of the concentration of fluorine atoms to the concentration of carbon atoms (represented as [F/C]) and the ratio of the concentration of sulfur atoms to the concentration of carbon atoms (represented as [S/C]) every one minute of the sputtering time, calculated from the obtained concentration of carbon atoms, concentration of fluorine atoms and concentration of sulfur atoms, are shown in the right column in Table 1.

Further, in the bottom row in Table 1, the average [F/C] i.e. $[F/C]_{(ii)}$ and the average [S/C] i.e. $[S/C]_{(ii)}$ in the superficial interior region (at a distance of from 4 to 7 nm from the surface) to be indices of the cured resin film of the present invention are shown.

TABLE 1

| Sputtering time [min] | Distance from surface [nm] | Concentration of atoms [atom %] | | | Ratio | |
|---|---|---|---|---|---|---|
| | | C1s | F1s | S2s | F/C | S/C |
| 0 | 0 | 50.4 | 21.4 | 0.7 | 0.425 | 0.013 |
| 1 | 0.7 | 84.6 | 0.0 | 1.2 | 0.000 | 0.014 |
| 2 | 1.4 | 92.3 | 0.0 | 1.6 | 0.000 | 0.017 |
| 3 | 2.1 | 95.0 | 0.0 | 1.2 | 0.000 | 0.013 |
| 4 | 2.8 | 95.0 | 0.0 | 1.5 | 0.000 | 0.015 |

TABLE 1-continued

| Sputtering time [min] | Distance from surface [nm] | Concentration of atoms [atom %] | | | Ratio | |
|---|---|---|---|---|---|---|
| | | C1s | F1s | S2s | F/C | S/C |
| 5 | 3.5 | 95.3 | 0.0 | 1.2 | 0.000 | 0.013 |
| 6 | 4.2 | 96.1 | 0.0 | 1.4 | 0.000 | 0.015 |
| 7 | 4.9 | 97.6 | 0.0 | 1.4 | 0.000 | 0.014 |
| 8 | 5.6 | 94.4 | 0.0 | 1.5 | 0.000 | 0.016 |
| 9 | 6.3 | 96.5 | 0.0 | 1.3 | 0.000 | 0.013 |
| 10 | 7 | 96.6 | 0.0 | 1.4 | 0.000 | 0.015 |
| Average in superficial interior region (distance of 4 to 7 nm from surface) | | | | | 0.000 | 0.015 |

FIG. 2 shows the ratios of the concentration of fluorine atoms and the concentration of sulfur atoms to the concentration of carbon atoms in the distance (thickness) direction from the surface obtained from Table 1, by a dotted line for fluorine atoms and a solid line for sulfur atoms.

As shown in FIG. 2, the ratio of the concentration of fluorine atoms to the concentration of carbon atoms i.e. $[F/C]_{(i)}$ on the surface of partition walls as the cured resin film is 0.425 in Ex. 16 as an Example of the present invention. Further, the ratio of the concentration of sulfur atoms to the concentration of carbon atoms at the surface of the partition walls i.e. $[S/C]_{(i)}$ is 0.013. Further, $[F/C]_{(ii)}$ is 0.000 and $[S/C]_{(ii)}$ is 0.015. Hereinafter a value of the ratio of 0.000 will be represented as "0".

(I) Ratio of Concentration of Fluorine Atoms to Concentration of Carbon Atoms

Of the cured resin film of the present invention, [F/C] at the surface which is represented as the above $[F/C]_{(i)}$ is from 0.100 to 3.000. When $[F/C]_{(i)}$ is within such a range, sufficient liquid repellency will be exhibited on the surface of the cured resin film. If $[F/C]_{(i)}$ is lower than 0.100, the amount of F is insufficient, and liquid repellency will not be exhibited. Further, if $[F/C]_{(i)}$ is higher than 3.000, the liquid repellency tends to be unstable. This is considered to be because of a decrease in the curability of the surface. $[F/C]_{(i)}$ is more preferably from 0.150 to 1.500, most preferably from 0.200 to 0.800.

In the cured resin film of the present invention, [F/C] at the surface which is represented as the above $[F/C]_{(i)}$ is higher than the average [F/C] in the superficial interior region (at a distance of from 4 to 7 nm from the surface) which is represented as $[F/C]_{(ii)}$. Thus, the amount of addition of components having liquid repellency may be suppressed, and the production cost can be suppressed. Further, since it is possible to impart liquid affinity to the side surfaces of the partition walls, uniformity will be maintained when the material is applied by an ink jet. Here, of the cured resin film of the present invention, $[F/C]_{(ii)}$ is preferably less than 0.100, more preferably less than 0.050, most preferably 0.

(II) Ratio of Concentration of Sulfur Atoms to Concentration of Carbon Atoms

Of the cured resin film of the present invention, [S/C] at the surface which is represented as the above $[S/C]_{(i)}$ and the average [S/C] in the superficial interior region (at a distance of from 4 to 7 nm from the surface) which is represented as $[S/C]_{(ii)}$ are both from 0.001 to 0.050. When both $[S/C]_{(i)}$ and $[S/C]_{(ii)}$ are within such a range, sufficient curability will be exhibited even at a low exposure amount. If $[S/C]_{(i)}$ and $[S/C]_{(i)}$ are lower than 0.001, curability at a low exposure amount tends to be insufficient, and film peeling or the like may occur. Further, if they are higher than 0.050, drawbacks such as an increase in the line width may occur.

Of the cured resin film of the present invention, $[S/C]_{(ii)}$ is further preferably from 0.001 to 0.040, most preferably from 0.001 to 0.035. Further, $[S/C]_{(i)}$ is further preferably from 0 to 0.040, most preferably from 0 to 0.035.

The difference between $[S/C]_{(i)}$ and $[S/C]_{(ii)}$ is preferably at most 0.010, particularly preferably at most 0.005.

Further, for example, in a case where a cured resin film disposed inside of a device, is to be analyzed by the above XPS, it is necessary to expose the cured resin film from the device. Now, an example of the method for exposing the surface of a cured resin film disposed inside of a device will be described, but the exposing method is not limited to the following one.

As a method for exposing the surface of a cured resin film disposed inside of a device, for example, Surface And Interfacial Cutting Analysis System (hereinafter referred to as SAICAS) may be mentioned. As an exposing method using SAICAS, for example, in a case where the device is an organic EL display, it is possible to expose the surface of partition walls by removing a cover glass and cutting an exposed laminate including a luminescent layer and partition walls (a cured resin film) as a whole obliquely to the depth direction.

Likewise, in a case where the device is an organic EL display, as an exposing method using XPS, it is possible to expose the surface of partition walls by removing a thin film at the top of partition walls (a cured resin film) by using a sputtering gun for argon, cesium, oxygen, gallium, gold, etc. which is built-in in the apparatus.

Further, as an exposing method using chemical etching, in a case where the device is an organic EL display, it is possible to expose the surface of partition walls by a method of dissolving one or both of electrodes sandwiching partition walls (a cured resin film) by an acid or alkali to form a space above and/or below the partition walls and peeling the laminate.

The cured resin film of the present invention is a cured resin film formed on a substrate and is not particularly limited so long as it is one having the above composition characteristics (I) and (II) by analyses by means of XPS. The cured resin film of the present invention having such characteristics may be formed on a substrate, for example, by using a negative photosensitive resin composition of the present invention which will be described below.

[Negative Photosensitive Resin Composition]

The negative photosensitive resin composition of the present invention comprises an alkali-soluble resin or alkali-soluble monomer (A) having an ethylenic double bond, a photopolymerization initiator (B), a thiol compound (C) having at least three mercapto groups per molecule, and an ink repellent agent (D).

The negative photosensitive resin composition of the present invention may further contain, as a case requires, a cross-linking agent (E), a solvent (F), a colorant (G), other optional components, etc.

Now, the respective components will be described.

(Alkali-Soluble Resin or Alkali-Soluble Monomer (A))

In the following description, symbol (AP) will be put to an alkali-soluble resin having an ethylenic double bond, and symbol (AM) will be put to an alkali-soluble monomer having an ethylenic bond.

The alkali-soluble resin (AP) having an ethylenic double bond is preferably a photosensitive resin having an acidic group and an ethylenic double bond in one molecule. Since the alkali-soluble resin (AP) has an ethylenic double bond in its molecule, an exposed portion of the negative photosensitive resin composition will be polymerized and cured by radicals formed from the photopolymerization initiator (B). On that occasion, the thiol compound (C) having at least three mercapto groups per molecule generates radicals, and due to high chain transfer properties, the radicals well affect the ethylenic double bond and contribute to polymerization and cross-linking, thus allowing curing to sufficiently proceed.

Such an exposed portion thus sufficiently cured will not be removed by an alkaline developer. Further, since the alkali-soluble resin (AP) has an acidic group in its molecule, a non-exposed portion of the negative photosensitive resin composition, which is not cured, can selectively be removed by an alkali developer. As a result, the cured film may be made in the form of partition walls to partition a prescribed area into a plurality of compartments.

As the acidic group, a carboxy group, a phenolic hydroxy group, a sulfo group and a phosphoric group may, for example, be mentioned, and one of them may be used alone, or two or more of them may be used in combination.

As the ethylenic double bond, addition-polymerizable double bonds such as a (meth)acryloyl group, an allyl group, a vinyl group, a vinyloxy group and a vinyloxyalkyl group, may be mentioned. One of them may be used alone, or two or more of them may be used in combination. Further, some or all of hydrogen atoms in the ethylenic double bond may be substituted by an alkyl group such as a methyl group.

As the alkali-soluble resin (AP) having an ethylenic double bond, a resin (A-1) having a side chain with an acidic group and a side chain with an ethylenic double bond, and a resin (A-2) having an acidic group and an ethylenic double bond introduced into an epoxy resin, may, for example, be mentioned. One of them may be used alone, or two or more of them may be used in combination.

The resin (A-1) may be synthesized, for example, by the following methods (i) and (ii).

(i) A monomer having, in a side chain, a reactive group other than an acidic group, such as a hydroxy group, and a reactive group such as an epoxy group, and a monomer having an acidic group in a side chain, are copolymerized to obtain a copolymer having a side chain with a reactive group and a side chain with an acidic group. This copolymer is reacted with a compound having an ethylenic double bond and a functional group to be bonded to the above reactive group. Otherwise, a monomer having an acidic group such as a carboxy group in a side chain is copolymerized, and then, a compound having an ethylenic double bond and a functional group to be bonded to the acidic group, is reacted in such an amount that the acidic group will remain after the reaction.

(ii) A monomer having, in a side chain, the same reactive group other than an acidic group, as in the above (i) and a compound having a protected ethylenic double bond and a functional group to be bonded to the reactive group, are reacted. Then, this monomer and a monomer having an acidic group in a side chain are copolymerized, and then, the protection of the ethylenic double bond is removed. Otherwise, a monomer having an acidic group in a side chain and a monomer having a protected ethylenic double bond in a side chain are copolymerized, and then, the protection of the ethylenic double bond is removed.

Here, the methods (i) and (ii) are preferably carried out in a solvent.

Among the above methods, the method (i) is preferably used. Now, the method (i) will be specifically described.

The monomer having a hydroxy group as a reactive group may, for example, be 2-hydroxyethyl (meth)acrylate, 2-hydroxypropyl (meth)acrylate, neopentyl glycol mono(meth)acrylate, glycerol mono(meth)acrylate, 2-hydroxyethyl vinyl ether, 2-hydroxyethyl allyl ether, N-hydroxymethyl (meth)acrylamide, N,N-bis(hydroxymethyl) (meth)acrylamide, etc.

In the case of using the monomer having a hydroxy group as a reactive group, the monomer having an acidic group to be copolymerized, may, for example, be 2-(meth)acryloyloxyethyl phosphate, as a monomer having a phosphoric group, in addition to the after-mentioned monomer having a carboxy group. The copolymerization of the monomer having a hydroxy group as a reactive group and a monomer having an acidic group, may be carried out by a known method.

The compound having an ethylenic double bond and a functional group to be bonded to the hydroxy group, to be reacted with the obtained copolymer, may, for example, be an acid anhydride having an ethylenic double bond, a compound having an isocyanate group and an ethylenic double bond, or a compound having an acyl chloride group and an ethylenic double bond.

The acid anhydride having an ethylenic double bond, may, for example, be maleic anhydride, itaconic anhydride, citraconic anhydride, methyl-5-norbornene-2,3-dicarboxylic acid anhydride, 3,4,5,6-tetrahydrophthalic acid anhydride, cis-1,2,3,6-tetrahydrophthalic acid anhydride or 2-buten-1-yl succinic anhydride.

The compound having an isocyanate group and an ethylenic double bond, may, for example, be 2-(meth)acryloyloxyethyl isocyanate or 1,1-bis((meth)acryloyloxymethyl)ethyl isocyanate.

The compound having an acyl chloride group and an ethylenic double bond, may, for example, be (meth)acryloyl chloride.

The monomer having an epoxy group as a reactive group, may, for example, be glycidyl (meth)acrylate or 3,4-epoxycyclohexymethyl (meth)acrylate.

As the monomer having an acidic group to be copolymerized with the monomer having an epoxy group as a reactive group, the same monomer as described above with respect to the monomer having a hydroxy group as a reactive group, may be used, and the copolymerization of the monomer having an epoxy group as a reactive group and the monomer having an acidic group, may also be carried out by a known method.

The compound having an ethylenic double bond and a functional group to be bonded to the epoxy group, to be reacted with the obtained copolymer, may, for example, be a compound having an ethylenic double bond and a carboxy group. Specific examples of such a compound may be (meth)acrylic acid, vinyl acetic acid, crotonic acid, itaconic acid, maleic acid, fumaric acid, cinnamic acid and their salts, and in the case of a dibasic acid, a monoester may be mentioned. Further, a carboxy group may be introduced into the resin (A-1) by reacting an acid anhydride wherein a dehydration condensation portion of a carboxylic acid and a hydroxyl group formed here constitutes a part of a ring structure.

The monomer having a carboxy group as a reactive group may, for example, be (meth)acrylic acid, vinyl acetic acid, crotonic acid, itaconic acid, maleic acid, fumaric acid, cinnamic acid or their salts, and in the case of a dibasic acid, a monoester may be mentioned. Further, such a monomer may be used also as the above-described monomer having an acidic group.

In the case of using the monomer having a carboxy group as a reactive group, this monomer is polymerized as mentioned above. As a compound having an ethylenic double bond and a functional group to be bonded to the carboxy group, to be reacted with the obtained polymer, a compound having an ethylenic double bond and an epoxy group may be mentioned. As such a compound, glycidyl (meth)acrylate and 3,4-epoxycyclohexylmethyl (meth)acrylate may, for example, be mentioned. Here, in such a case, the amount of the compound having an ethylenic double bond and a functional group to be bonded to the carboxy group, to be reacted with the polymer having a carboxy group, is adjusted to be such an amount that the carboxy group will remain as an acidic group in a side chain in the polymer after the reaction.

The resin (A-2) may be synthesized by reacting an epoxy resin with the after-described compound having an ethylenic double bond and a carboxy group, followed by a reaction with a polybasic carboxylic acid or its anhydride.

Specifically, by the reaction of the epoxy resin with the compound having an ethylenic double bond and a carboxy group, the ethylenic double bond is introduced to the epoxy resin. Then, by the reaction of the epoxy resin having the ethylenic double bond introduced, with the polybasic acid or its anhydride, the carboxy group may be introduced.

The epoxy resin is not particularly limited and may, for example, be a bisphenol A-type epoxy resin, a bisphenol F-type epoxy resin, a phenol novolac-type epoxy resin, a cresol novolac-type epoxy resin, a trisphenol methane-type epoxy resin, an epoxy resin having a naphthalene skeleton, an epoxy resin having a biphenyl skeleton represented by the following formula (A-2a), a fluorenyl-substituted bisphenol A-type epoxy resin represented by the following formula (A-2b) and an epoxy resin having a biphenyl skeleton represented by the following formula (A-2c).

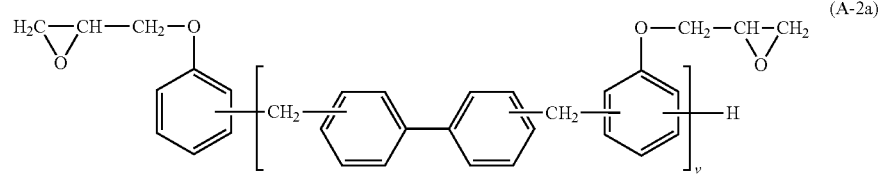

(A-2a)

(wherein v is an integer of from 1 to 50, preferably an integer of from 2 to 10, and each of hydrogen atoms in a benzene ring, which are independent of one another, may be substituted by a $C_{1-12}$ alkyl group, a halogen atom or a phenyl group of which some of hydrogen atoms may be substituted by a substituent.).

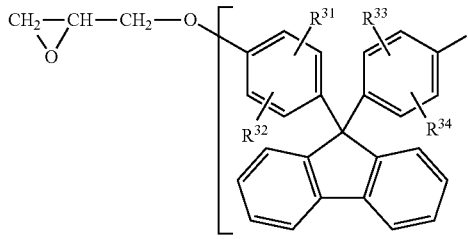

(A-2b)

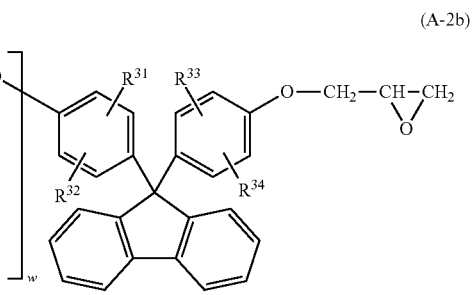

(wherein each of $R^{31}$, $R^{32}$, $R^{33}$ and $R^{34}$ which are independent of one another, is a hydrogen atom, a chlorine atom or a $C_{1-5}$ alkyl group, and w is 0 or an integer of from 1 to 10.).

(A-2c)

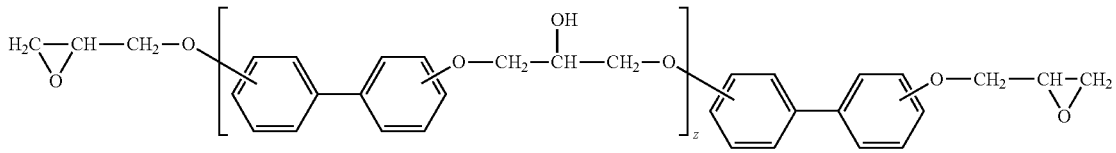

(wherein each of hydrogen atoms in a benzene ring, which are independent of one another, may be substituted by a $C_{1-12}$ alkyl group, a halogen atom or a phenyl group of which some of hydrogen atoms may be substituted by a substituent, and z is 0 or an integer of from 1 to 10.).

Further, in a case where a polybasic carboxylic acid anhydride is reacted after reacting the epoxy resin represented by the formula (A-2a), (A-2b) or (A-2c) with the compound having an ethylenic double bond and a carboxy group, it is preferred to use a mixture of a dicarboxylic acid anhydride and a tetracarboxylic acid dianhydride, as the polybasic carboxylic acid anhydride.

As the compound having an ethylenic double bond and a carboxy group, (meth)acrylic acid, vinyl acetic acid, crotonic acid, itaconic acid, maleic acid, fumaric acid, cinnamic acid and their salts are preferred, and in the case of a dibasic acid, a monoester is preferred, and (meth)acrylic acid is particularly preferred.

As the alkali-soluble resin (AP) having an ethylenic double bond, it is preferred to use the resin (A-2), since peeling of a cured film during the development is prevented, and it is possible to obtain a dot pattern with a high resolution, since the linearity of the pattern is good in a case where dots are in a linear form, and since a smooth cured film surface is readily obtainable.

As the resin (A-2), particularly preferred is a resin having an acidic group and an ethylenic double bond introduced to a bisphenol A-type epoxy resin, a resin having an acidic group and an ethylenic double bond introduced to a bisphenol F-type epoxy resin, a resin having an acidic group and an ethylenic double bond introduced to a phenol novolac-type epoxy resin, a resin having an acidic group and an ethylenic double bond introduced to a cresol novolac-type epoxy resin, a resin having an acidic group and an ethylenic double bond introduced to a trisphenol methane-type epoxy resin, or a resin having an acidic group and an ethylenic double bond introduced to an epoxy resin represented by the formula (A-2a), (A-2b) or (A-2c).

As the alkali-soluble monomer (AP) having an ethylenic double bond, for example, a monomer (A-3) having a side chain with an acidic group and a side chain with an ethylenic double bond, is preferably used. The acidic group and the ethylenic double bond are the same as in the alkali-soluble resin (AP) having an ethylenic double bond.

The monomer (A-3) may, for example, be 2,2,2-triacryloyloxymethylethylphthalic acid.

As the alkali-soluble resin or alkali-soluble monomer (A) having an ethylenic double bond to be contained in the negative photosensitive resin composition, one type may be used alone, or two or more types may be used in combination.

The content of the alkali-soluble resin or alkali-soluble monomer (A) having an ethylenic double bond in the total solid content in the negative photosensitive resin composition is preferably from 5 to 80 mass %, particularly preferably from 10 to 60 mass %. When the content is within the above range, the photocurability and developing properties of the negative photosensitive resin composition are good.

(Photopolymerization Initiator (B))

The photopolymerization initiator (B) in the present invention is not particularly limited so long as it is a compound having a function as a photopolymerization initiator, and a compound which generates radicals by light, is preferred.

The photopolymerization initiator (B) may, for example, be an α-diketone such as methyl phenyl glyoxylate or 9,10-phenanthrenequinone; an acyloin such as benzoin; an acyloin ether such as benzoin methyl ether, benzoin ethyl ether or benzoin propyl ether; a thioxanthone such as thioxanthone, 2-chlorothioxanthone, 2-methylthioxanthone, 2,4-dimethylthioxanthone, isopropylthioxanthone or 2,4-diethylthioxanthone; a benzophenone such as benzophenone, 4,4'-bis(dimethylamino)benzophenone or 4,4'-bis(diethylamino)benzophenone; an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-1-[4-(methylthio)phenyl]-2-morpholinopropan-1-one or 2-benzyl-2-dimethylamino-1-(4-morpholinophenyl)-butan-1-one; a quinone such as anthraquinone, 2-ethyl anthraquinone, camphorquinone or 1,4-naphthoquinone; an aminobenzoic acid such as ethyl 2-dimethylaminobenzoate or (n-butoxy)ethyl 4-dimethylaminobenzoate; a halogenated compound such as phenacyl chloride or a trihalomethylphenyl sulfone; an acylphosphine oxide such as bis(2,4,6-trimethylbenzoyl)-phenylphosphine oxide; a peroxide such as di-t-butyl peroxide; an oxime ester such as 1,2-octanedione, 1-[4-(phenylthio)-, 2-(O-benzoyloxime) or ethanone 1-[9-ethyl-6-(2-methylbenzoyl)-9H-carbazol-3-yl]-1-(O-acetyloxime); an aliphatic amine such as triethanolamine, methyldiethanolamine, triisopropanolamine, n-butylamine, N-methyldiethanolamine or diethylaminoethyl methacrylate; etc.

Among such photopolymerization initiators (B), benzophenones, aminobenzoic acids and aliphatic amines are preferred, since they may exhibit sensitization effects when used together with other radical initiators.

As the photopolymerization initiator (B), preferred is 2-methyl-1-[4-(methylthio)phenyl]-2-morpholinopropan-1-one, 2-benzyl-2-dimethylamino-1-(4-morpholinophenyl)-butan-1-one, 1,2-octanedione, 1-[4-(phenylthio)-, 2-(O-benzoyloxime), ethanone 1-[9-ethyl-6-(2-methylbenzoyl)-9H-carbazol-3-yl]-1-(O-acetyloxime) or 2,4-diethylthioxanthone. Further, a combination of this with a benzophenone such as 4,4'-bis(diethylamino)benzophenone is particularly preferred.

As the photopolymerization initiator (B), one type may be used alone, or two or more types may be used in combination.

The content of the photopolymerization initiator (B) in the total solid content in the negative photosensitive resin composition is preferably from 0.1 to 50 mass %, more preferably from 0.5 to 30 mass %, particularly preferably from 5 to 15 mass %. When the content is within the above range, the photocurability and developing properties of the negative photosensitive resin composition are good.

(Thiol Compound (C))

The thiol compound (C) in the present invention is a compound having at least 3 mercapto groups in one molecule. By containing the thiol compound (C), in the negative photosensitive resin composition of the present invention, at the time of exposure, radicals of the thiol compound (C) are generated by radicals generated from the photopolymerization initiator (B) to act on the ethylenic double bond of the alkali-soluble resin or alkali-soluble monomer (A), that is, a so-called ene-thiol reaction occurs. This ene-thiol reaction has such advantageous that it has high chain transfer properties since it is not susceptible to inhibition of reaction by oxygen, different from a usual ethylenic double bond which undergoes radical polymerization, and further, cross-linking occurs simultaneously with polymerization, whereby the shrinkage ratio when the composition is formed into a cured product is low, and a uniform network is readily obtained.

The negative photosensitive resin composition of the present invention, which contains the thiol compound (C), may be sufficiently cured even at a low exposure amount as described above, and is sufficiently photo-cured even at the upper layer portion containing the upper surface of the partition walls susceptible to inhibition of the reaction by oxygen, and it is thereby possible to impart good ink repellency to the upper surface of the partition walls.

The number of mercapto groups in the thiol compound (C) is preferably from 3 to 10 in one molecule, more preferably from 3 to 8, further preferably from 3 to 5. From the viewpoint of the storage stability of the negative photosensitive resin composition, it is particularly preferably 3.

The molecular weight of the thiol compound (C) is not particularly limited. The mercapto group equivalent (hereinafter referred to also as "SH equivalent") represented by [molecular weight/number of mercapto groups] in the thiol compound (C) is preferably from 40 to 1,000, more preferably from 40 to 500, particularly preferably from 40 to 250 from the viewpoint of the curability at a low exposure amount.

The thiol compound (C) is preferably an ester of a mercapto carboxylic acid with a polyhydric alcohol. The thiol compound (C) may be either an aliphatic compound or an aromatic compound.

The mercapto carboxylic acid may, for example, be thioglycolic acid, 2-mercaptopropionic acid, 3-mercaptopropionic acid, 3-mercaptobutanoic acid, 3-mercaptoisobutanoic acid, 2-mercaptoisobutyric acid, 3-mercaptoisobutyric acid, 3-mercapto-3-methylbutyric acid, 2-mercaptovaleric acid, 3-mercaptoisovaleric acid, 4-mercaptovaleric acid or 3-phenyl-3-mercaptopropionic acid.

The polyhydric alcohol may, for example, be an alcohol having at least 3 hydroxy groups such as glycerol, diglycerol, trimethylolethane, trimethylolpropane, triethylolethane, triethylolpropane, ditrimethylolpropane, tris(2-hydroxyethyl)isocyanurate, hexanetriol, sorbitol, pentaerythritol, dipentaerythritol or sucrose.

The thiol compound (C) may, for example, be specifically tris(2-mercaptopropanoyloxyethyl)isocyanurate, pentaerythritol tetrakis(3-mercaptobutyrate), trimethylolpropane tristhioglycolate, pentaerythritol tristhioglycolate, pentaerythritol tetrakisthioglycolate, dipentaerythritol hexathioglycolate, trimethylolpropane tris(3-mercaptopropionate), pentaerythritol tetrakis(3-mercaptopropionate), tris[(3-mercaptopropionyloxy)-ethyl]-isocyanurate, dipentaerythritol hexa(3-mercaptopropionate), trimethylolpropane tris(3-mercaptobutyrate), pentaerythritol tetrakis(3-mercaptobutyrate), dipentaerythritol hexa(3-mercaptobutyrate), trimethylolpropane tris(2-mercaptoisobutyrate), 1,3,5-tris(3-mercaptobutyryloxyethyl)-1,3,5-triazine-2,4,6(1H,3H,5H)-trione, triphenolmethane tris(3-mercaptopropionate), triphenolmethane tris(3-mercaptobutyrate), trimethylolethane tris(3-mercaptobutyrate) or 2,4,6-trimercapto-S-triazine.

As the thiol compound (C), one type may be used alone, or two or more types may be used in combination.

The negative photosensitive resin composition of the present invention contains the thiol compound (C) in such an amount that the amount of the mercapto groups of the compound is preferably from 0.0001 to 1 mol, more preferably from 0.0005 to 0.5 mol, particularly preferably from 0.001 to 0.5 mol per 1 mol of the ethylenic double bond in the total solid content in the negative photosensitive resin composition. When the content of the thiol compound (C) is within the above range, the photocurability and developing properties of the negative photosensitive resin composition are good even at a low exposure amount.

(Ink Repellent Agent (D))

In the present invention, the ink repellent agent (D) has ink repellency and a nature to migrate to the upper surface (upward migration nature) in a process for forming a cured film by using a negative photosensitive resin composition which contains the ink repellent agent. By using the ink repellent agent (D), the upper layer portion including the upper surface of the obtainable cured film becomes to be a layer wherein the ink repellent agent (D) is present densely (hereinafter sometimes referred to as "ink repellent layer"), and ink repellency will be imparted to the upper surface of the cured film.

The ink repellent agent (D) having such a nature preferably has fluorine atoms from the viewpoint of the upward migration nature and the ink repellency.

The content of fluorine atoms in the ink repellent agent (D) is preferably from 1 to 40 mass %, more preferably from 5 to 35 mass %, particularly preferably from 10 to 30 mass %. When the content of fluorine atoms in the ink repellent agent (D) is at least the lower limit value in the above range, good ink repellency can be imparted to the upper surface of the cured film, and when it is at most the upper limit value, the compatibility with other components in the negative photosensitive resin composition will be good.

Further, the ink repellent agent (D) is preferably a compound having an ethylenic double bond. By the ink repellent agent (D) having an ethylenic double bond, radicals of the thiol compound (C) act on the ethylenic double bond of the ink repellent agent (D) which has migrated to the upper surface, whereby cross-linking of the ink repellent agent (D) each other or between the ink repellent agent (D) and other component having an ethylenic double bond contained in the negative photosensitive resin composition via (co)polymerization and/or the thiol compound (C).

It is thereby possible to improve the fixing properties of the ink repellent agent (D) in the upper layer of the cured film, i.e. in the ink repellent layer, in production of a cured film by curing the negative photosensitive resin composition.

By the negative photosensitive resin composition of the present invention containing the thiol compound (C), the ink repellent agent (D) can be sufficiently fixed to the ink repellent layer even in a case where the exposure amount at the time of exposure is low. In a case where the ink repellent agent (D) contains an ethylenic double bond, the mechanism is as mentioned above. In a case where the ink repellent agent (D) does not have an ethylenic double bond, curing of the photocurable component composed mainly of the alkali-soluble resin or alkali-soluble monomer (A) present around the ink repellent agent (D) is sufficiently carried out, whereby the ink repellent agent (D) can sufficiently be fixed.

Usually, in a case where an ethylenic double bond undergoes radical polymerization, the surface of the cured film or the partition walls in contact with the air is more susceptible to inhibition of the reaction by oxygen, however, the radical reaction by the thiol compound (C) is hardly susceptible to inhibition of the reaction by oxygen, and thus such a reaction is particularly advantageous for fixation of the ink repellent agent (D) at a low exposure amount. Further, in production of partition walls, at the time of carrying out development, it is possible to sufficiently prevent the ink repellent agent (D) from detaching from the ink repellent layer, or prevent peeling of the upper surface of the ink repellent layer.

The ink repellent agent (D) may, for example, be a partially hydrolyzed condensate of a hydrolysable silane compound. As the hydrolysable silane compound, one type may be used alone, or two or more types may be used in combination. The ink repellent agent (D) comprising a partially hydrolyzed condensate of a hydrolysable silane compound and having fluorine atoms may, for example, be specifically the following ink repellent agent (D1). As the ink repellent agent (D) having fluorine atoms, an ink repellent agent (D2), of which the main chain is a hydrocarbon chain and which contains a side chain having fluorine atoms may also be used.

As the ink repellent agent (D1) and the ink repellent agent (D2) which are used alone or in combination for the negative photosensitive resin composition of the present invention, the ink repellent agent (D1) is particularly preferably used in view of excellent ultraviolet/ozone resistance.

<Ink Repellent Agent (D1)>

The ink repellent agent (D1) is a partially hydrolyzed condensate of a hydrolysable silane compound mixture (hereinafter sometimes referred to as "mixture (M)"). The mixture (M) contains a hydrolysable silane compound (hereinafter sometimes referred to as a "hydrolysable silane compound (S1)") having a fluoroalkylene group and/or a fluoroalkyl group, and a hydrolysable group, as an essential component and optionally contains a hydrolysable silane compound other than the hydrolysable silane compound (s1). As the hydrolysable silane compound which the mixture (M) optionally contains, the following hydrolysable silane compounds (s2) to (s5) may be mentioned. As the hydrolysable silane compound which the mixture (M) optionally contains, the hydrolysable silane compound (s2) is particularly preferred.

Hydrolyzable silane compound (s2): a hydrolysable silane compound having four hydrolysable groups bonded to a silicon atom.

Hydrolyzable silane compound (s3): a hydrolysable silane compound having a hydrolysable group and a group having an ethylenic double bond, and containing no fluorine atom.

Hydrolyzable silane compound (s4): a hydrolysable silane compound having only a hydrolysable group and a hydrocarbon group as groups bonded to a silicon atom.

Hydrolyzable silane compound (s5): a hydrolysable silane compound having a mercapto group and a hydrolysable group, and containing no fluorine atom.

Now, hydrolysable silane compounds (s1) to (s5) will be described.

<1> Hydrolysable Silane Compound (s1)

By using hydrolysable silane compound (s1), the ink repellent agent (D1) has fluorine atoms in the form of a fluoroalkylene group and/or a fluoroalkyl group, whereby it has excellent upward migration nature and ink repellency. In order to bring these characteristics of the hydrolysable silane compound (s1) to a higher level, the hydrolysable silane compound (s1) more preferably has at least one member selected from the group consisting of a fluoroalkyl group, a perfluoroalkylene group and a perfluoroalkyl group, and particularly preferably has a perfluoroalkyl group. Further, a perfluoroalkyl group containing an etheric oxygen atom is also preferred. That is, the most preferred compound as the hydrolysable silane compound (s1) is a compound having a perfluoroalkyl group and/or a perfluoroalkyl group containing an etheric oxygen atom.

As the hydrolysable group, an alkoxy group, a halogen atom, an acyl group, an isocyanate group, an amino group and a group having at least one hydrogen in an amino group substituted by an alkyl group, may, for example, be mentioned. A $C_{1-4}$ alkoxy group and a halogen atom are preferred, a methoxy group, an ethoxy group and a chlorine atom are more preferred, and a methoxy group and an ethoxy group are particularly preferred, since they become hydroxy groups (silanol groups) by a hydrolysis reaction and further, a reaction to form a Si—O—Si bond by their intermolecular condensation reaction tends to smoothly proceed.

As the hydrolysable silane compound (s1), one type may be used alone, or two or more types may be used in combination.

As the hydrolysable silane compound (s1), a compound represented by the following formula (dx-1) is preferred.

$$(A\text{-}R^{F11})_a\text{—Si}(R^{H11})_b X^{11}_{(4-a-b)} \qquad (\text{dx-1})$$

In the formula (dx-1), the respective symbols have the following meanings.

$R^{F11}$ is a $C_{1-16}$ bivalent organic group which contains at least one fluoroalkylene group and which may contain an etheric oxygen atom.

$R^{H11}$ is a $C_{1-6}$ hydrocarbon group.

a is 1 or 2, and b is 0 or 1, provided that a+b is 1 or 2.

A is a fluorine atom or a group represented by the following formula (Ia).

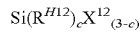

$$Si(R^{H12})_c X^{12}{}_{(3-c)} \qquad (Ia)$$

$R^{H12}$ is a $C_{1-6}$ hydrocarbon group.

c is 0 or 1.

$X^{11}$ and $X^{12}$ are hydrolysable groups.

When a plurality of $X^{11}$ are present, they may be the same or different from one another.

When a plurality of $X^{12}$ are present, they may be the same or different from one another.

When a plurality of $A$-$R^{F11}$ are present, they may be the same or different from one another.

The compound (dx-1) is a fluorinated hydrolysable silane compound having one or two 2- or 3-functional hydrolysable silyl groups.

As $R^{H11}$ and $R^{H12}$, a $C_{1-3}$ hydrocarbon group is preferred, and a methyl group is particularly preferred.

In the formula (dx-1), it is particularly preferred that a is 1, and b is 0 or 1.

Specific examples and preferred modes of $X^{11}$ and $X^{12}$ are as mentioned above.

As the hydrolysable silane compound (s1), a compound represented by the following formula (dx-1a) is particularly preferred.

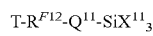

$$T\text{-}R^{F12}\text{-}Q^{11}\text{-}SiX^{11}{}_3 \qquad (dx\text{-}1a)$$

In the formula (dx-1a), the respective symbols have the following meanings.

$R^{F12}$ is a $C_{2-15}$ perfluoroalkylene group which may contain an etheric oxygen atom.

T is a fluorine atom or a group represented by the following formula (Ib).

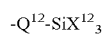

$$\text{-}Q^{12}\text{-}SiX^{12}{}_3 \qquad (Ib)$$

$X^{11}$ and $X^{12}$ are hydrolysable groups.

Three $X^{11}$ may be the same or different from one another.

Three $X^{12}$ may be the same or different from one another.

$Q^{11}$ and $Q^{12}$ are $C_{1-10}$ bivalent organic groups containing no fluorine atoms.

In the formula (dx-1a), when T is a fluorine atom, $R^{F12}$ is preferably a $C_{4-8}$ perfluoroalkylene group, or a $C_{4-10}$ perfluoroalkylene group containing an etheric oxygen atom, more preferably a $C_{4-8}$ perfluoroalkylene group, particularly preferably a $C_6$ perfluoroalkylene group.

Further, in the formula (dx-1a), when T is a group (Ib), $R^{F12}$ is preferably a $C_{3-15}$ perfluoroalkylene group, or a $C_{3-15}$ perfluoroalkylene group containing an etheric oxygen atom, particularly preferably a $C_{4-6}$ perfluoroalkylene group.

When $R^{F12}$ is the above-exemplified group, the ink repellent agent (D1) has good ink repellency, and the compound (dx-1a) is excellent in solubility in a solvent.

The structure of $R^{F12}$ may, for example, be a straight chain structure, a branched structure, a ring structure or a partially cyclic structure, and a straight chain structure is preferred.

As specific examples of $R^{F12}$, the following groups may be mentioned. $-(CF_2)_4-$, $-(CF_2)_6-$, $-(CF_2)_8-$, $-CF_2CF_2OCF_2CF_2OCF_2-$, $-CF_2CF_2OCF_2CF_2OCF_2CF_2-$, $-CF_2CF_2OCF_2CF_2OCF_2CF_2OCF_2CF_2OCF_2-$, $-CF_2CF_2OCF_2CF_2OCF_2CF_2OCF_2CF_2OCF_2CF_2-$, $-CF_2CF_2CF_2OCF_2-$, $-CF_2CF_2CF_2OCF_2CF_2-$, $-CF_2CF_2CF_2OCF(CF_3)-$, $-CF_2CF_2CF_2OCF(CF_3)CF_2-$, $-CF_2CF_2CF_2OCF(CF_3)CF_2OCF_2CF_2-$, $-CF_2CF_2CF_2OCF(CF_3)CF_2OCF(CF_3)-$, $-CF_2CF_2CF_2OCF(CF_3)CF_2OCF(CF_3)CF_2-$, $-CF_2OCF(CF_3)CF_2OCF(CF_3)-$, $-CF_2CF_2OCF(CF_3)CF_2OCF(CF_3)-$.

Specifically, when it is assumed that Si is to be bonded to the right hand side bond, and $R^{F12}$ is to be bonded to the left hand side bond, $Q^{11}$ and $Q^{12}$ are preferably a group represented by $-(CH_2)_{i1}-$ (wherein i1 is an integer of from 1 to 5), $-CH_2O(CH_2)_{i2}-$ (wherein i2 is an integer of from 1 to 4), $-SO_2NR^1-(CH_2)_{i3}-$ (wherein $R^1$ is a hydrogen atom, a methyl group or an ethyl group, i3 is an integer of from 1 to 4, and the total number of carbon atoms in $R^1$ and $(CH_2)_{i3}$ is an integer of at most 4), or $-(C=O)-NR^1-(CH_2)_{i4}-$ (wherein $R^1$ is as defined above, i4 is an integer of from 1 to 4, and the total number of carbon atoms in $R^1$ and $(CH_2)_{i4}$ is an integer of at most 4). $Q^{11}$ and $Q^{12}$ are more preferably $-(CH_2)_{i1}-$ wherein i1 is an integer of from 2 to 4, particularly preferably $-(CH_2)_2-$.

Further, when $R^{F12}$ is a perfluoroalkylene group which contains no etheric oxygen atom, $Q^{11}$ and $Q^{12}$ are preferably a group represented by $-(CH_2)_{i1}-$, and i1 is more preferably an integer of from 2 to 4, and i1 is particularly preferably 2.

When $R^{F12}$ is a perfluoroalkylene group which contains an etheric oxygen atom, $Q^{11}$ and $Q^{12}$ are preferably a group represented by $-(CH_2)_{i1}-$, $-CH_2O(CH_2)_{i2}-$, $-SO_2NR^1-(CH_2)_{i3}-$ or $-(C=O)-NR^1-(CH_2)_{i4}-$. Also in this case, $-(CH_2)_{i1}-$ is more preferred, and i1 is more preferably an integer of from 2 to 4, and i1 is particularly preferably 2.

When D is a fluorine atom, the following compounds may be mentioned as specific examples of the compound (dx-1a).

$F(CF_2)_4CH_2CH_2Si(OCH_3)_3$,
$F(CF_2)_6CH_2CH_2Si(OCH_3)_3$,
$F(CF_2)_6CH_2CH_2CH_2Si(OCH_3)_3$,
$F(CF_2)_8CH_2CH_2Si(OCH_3)_3$,
$F(CF_2)_3OCF(CF_3)CF_2O(CF_2)_2CH_2CH_2Si(OCH_3)_3$,
$F(CF_2)_2O(CF_2)_2O(CF_2)_2CH_2CH_2Si(OCH_3)_3$.

When T is a group (1b), the following compounds may be mentioned as specific examples of the compound (dx-1a).

$(CH_3O)_3SiCH_2CH_2(CF_2)_4CH_2CH_2Si(OCH_3)_3$,
$(CH_3O)_3SiCH_2CH_2(CF_2)_6CH_2CH_2Si(OCH_3)_3$,
$(CH_3O)_3SiCH_2CH_2(CF_2)_6CH_2CH_2CH_2Si(OCH_3)_3$,
$(CH_3O)_3SiCH_2CH_2(CF_2)_2OCF_2(CF_3)CFO(CF_2)_2CH_2CH_2Si(OCH_3)_3$.

In the present invention, as the compound (dx-1a), particularly preferred are $F(CF_2)_6CH_2CH_2Si(OCH_3)_3$ and $F(CF_2)_{30}CF(CF_3)CF_2O(CF_2)_2CH_2CH_2Si(OCH_3)_3$.

The content of the hydrolysable silane compound (s1) in the mixture (M) is preferably such that the content of fluorine atoms in the partially hydrolyzed condensate obtainable from the mixture would be from 1 to 40 mass %, more preferably from 5 to 35 mass %, particularly preferably from 10 to 30 mass %. When the content of the hydrolysable silane compound (s1) is at least the lower limit value in the above range, good ink repellency can be imparted to the upper surface of the cured film, and when it is at most the upper limit value, the compatibility with other hydrolysable silane compounds in the mixture will be good.

<2> Hydrolysable Silane Compound (s2)

By incorporating the hydrolysable silane compound (s2) in the mixture (M) in the present invention, it is possible to improve the film-forming properties after the ink repellent agent (D1) has migrated to the upper surface, in a cured film formed by curing a negative photosensitive resin composition containing the ink repellent agent (D1). Namely, it is considered that since the number of hydrolysable groups in the hydrolysable silane compound (s2) is large, the ink repellent agent (D1) will well condense to each other after migrated to the upper surface to form a thin film over the entire upper surface thereby to form an ink repellent layer.

Further, by incorporating the hydrolysable silane compound (s2) in the mixture (M), the ink repellent agent (D1) becomes easily soluble in a hydrocarbon-type solvent.

As the hydrolysable silane compound (s2), one type may be used alone, or two or more types may be used in combination.

As the hydrolysable group, the same one as the hydrolysable group in the hydrolysable silane compound (s1) may be employed.

The hydrolysable silane compound (s2) may be represented by the following formula (dx-2).

$$SiX^2_4 \quad (dx\text{-}2)$$

In the formula (dx-2), $X^2$ is a hydrolysable group, and four $X^2$ may be the same or different from one another. As $X^2$, the same group as the above $X^{11}$ and $X^{12}$ is used.

The following compounds may be mentioned as specific examples of the compound (dx-2). Further, as the compound (dx-2), as a case requires, a partially hydrolyzed condensate obtained by preliminarily subjecting a plurality of such compounds to partial hydrolytic condensation may be used. $Si(OCH_3)_4$, $Si(OC_2H_5)_4$, a partially hydrolyzed condensate of $Si(OCH_3)_4$ (e.g. Methyl Silicate 51 (tradename), manufactured by Colcoat Co., Ltd.), and partially hydrolyzed condensates of $Si(OC_2H_5)_4$ (e.g. Ethyl Silicate 40 and Ethyl Silicate 48 (tradenames), manufactured by Colcoat Co., Ltd.).

The content of the hydrolysable silane compound (s2) in the mixture (M) is preferably from 0.01 to 5 mol, particularly preferably from 0.05 to 3 mol, per 1 mol of the hydrolysable silane compound (s1). When the content is at least the lower limit value in the above range, the film-forming properties of the ink repellent agent (D1) are good, and when it is at most the upper limit value, the ink repellency of the ink repellent agent (D1) is good.

<3> Hydrolysable Silane Compound (s3)

By incorporating the hydrolysable silane compound (s3) to the mixture (M) in the present invention, (co)polymerization of the ink repellent agent (D1) each other via a group having an ethylenic double bond, or between the ink repellent agent (D1) and other component having an ethylenic double bond, contained in the negative photosensitive resin composition, becomes possible, whereby an effect to improve the fixing properties of the ink repellent agent (D1) in the ink repellent layer will be obtained, as described above.

As the hydrolysable silane compound (s3), one type may be used alone, or two or more of them may be used in combination.

As the hydrolysable group, the same one as the hydrolysable group in the hydrolysable silane compound (s1) may be used.

The group having an ethylenic double bond is preferably a (meth)acryloyloxy group or a vinyl phenyl group, particularly preferably a (meth)acryloyloxy group.

As the hydrolysable silane compound (s3), a compound represented by the following formula (dx-3) is preferred.

$$(Y\text{-}Q^3)_g\text{-}Si(R^{H3})_h X^3_{(4-g-h)} \quad (dx\text{-}3)$$

In the formula (dx-3), the respective symbols have the following meanings.

Y is a group having an ethylenic double bond.

$Q^3$ is a $C_{1-6}$ bivalent organic group which contains no fluorine atom.

$R^{H3}$ is a $C_{1-6}$ hydrocarbon group.

$X^3$ is a hydrolysable group.

g is 1 or 2, and h is 0 or 1, provided that g+h is 1 or 2.

When a plurality of Y-$Q^3$ are present, they may be the same or different from one another.

When a plurality of $X^3$ are present, they may be the same or different from one another.

As $R^{H3}$, the same group as $R^{H11}$ and $R^{H12}$ may be used.

As $X^3$, the same group as $X^{11}$ and $X^{12}$ may be used.

Y is preferably a (meth)acryloyloxy group or a vinyl phenyl group, particularly preferably a (meth)acryloyloxy group.

As specific examples of $Q^3$, a $C_{2-6}$ alkylene group or a phenylene group may, for example, be mentioned. Among them, —$(CH_2)_3$— is preferred.

It is preferred that g is 1, and h is 0 or 1.

As the compound (dx-3), one type may be used alone, or two or more types may be used in combination.

As specific examples of the compound (dx-3), the following compounds may be mentioned.

$CH_2$=$C(CH_3)COO(CH_2)_3Si(OCH_3)_3$,
$CH_2$=$C(CH_3)COO(CH_2)_3Si(OC_2H_5)_3$,
$CH_2$=$CHCOO(CH_2)_3Si(OCH_3)_3$,
$CH_2$=$CHCOO(CH_2)_3Si(OC_2H_5)_3$,
$[CH_2$=$C(CH_3)COO(CH_2)_3]CH_3Si(OCH_3)_2$,
$[CH_2$=$C(CH_3)COO(CH_2)_3]CH_3Si(OC_2H_5)_2$

The content of the hydrolysable silane compound (s3) in the mixture (M) is preferably from 0.1 to 5 mol, particularly preferably from 0.5 to 4 mol per 1 mol of the hydrolysable silane compound (s1). When the content is at least the lower limit value in the above range, the upward migration nature of the ink repellent agent (D1) is good, further, the fixing properties of the ink repellent agent (D1) are good in the ink repellent layer including the upper surface after the upward migration, and furthermore, the storage stability of the ink repellent agent (D1) is good. When it is at most the upper limit value, the ink repellency of the ink repellent agent (D1) is good.

<4> Hydrolysable Silane Compound (s4)

In a case where the hydrolysable silane compound (s2) is used in the mixture (M) in the present invention, embossing may sometimes be formed at an edge of the upper surface of partition walls formed by curing a negative photosensitive resin composition. This is very small embossing at a level to be observed by a scanning electron microscope (SEM). The present inventors have ascertained that in such embossing, the content of F and/or Si is higher than in the other portions.

Although such embossing does not bring about any particular problem to partition walls, the present inventors have found it possible to prevent formation of such embossing by replacing a part of the hydrolysable silane compound (s2) with the hydrolysable silane compound (s4) having a less number of hydrolysable groups.

The film-forming properties of the ink repellent agent (D1) will increase by the reaction of silanol groups to one another formed by the hydrolysable silane compound (s2) having a large number of hydrolysable groups. However, because of the high reactivity, the above mentioned embossing is considered to occur. And, by replacing a part of the hydrolysable silane compound (s2) with the hydrolysable silane compound (s4) having a less number of hydrolysable groups, the reaction of silanol groups to one another is considered to be suppressed so that formation of embossing is thereby prevented.

As the hydrolysable silane compound (s4), one type may be used alone, or two or more types may be used in combination.

As the hydrolysable group, the same one as the hydrolysable group in the hydrolysable silane compound (s1) may be employed.

As the hydrolysable silane compound (s4), a compound represented by the following formula (dx-4) is preferred.

$(R^{H4})_j\text{—}SiX^4_{(4-j)}$ (dx-4)

The symbols in the formula (dx-4) have the following meanings.

$R^{H4}$ is a $C_{1-20}$ hydrocarbon group.

$X^4$ is a hydrolysable group.

j is an integer of from 1 to 3, preferably 2 or 3.

When a plurality of $R^{H4}$ are present, they may be the same or different from one another.

When a plurality of $X^4$ are present, they may be the same or different from one another.

As $R^{H4}$, when j is 1, a $C_{1-20}$ aliphatic hydrocarbon group or a $C_{6-10}$ aromatic hydrocarbon group may be mentioned, and a $C_{1-10}$ alkyl group, a phenyl group or the like is preferred. When j is 2 or 3, $R^{H4}$ is preferably a $C_{1-6}$ hydrocarbon group, more preferably a $C_{1-3}$ hydrocarbon group.

As $X^4$, the same group as the above $X^{11}$ and $X^{12}$ may be employed.

As specific examples of the compound (dx-4), the following compounds may be mentioned. In the formulae, Ph represents a phenyl group.

$(CH_3)_3\text{—}Si\text{—}OCH_3$, $(CH_3CH_2)_3\text{—}Si\text{—}OC_2H_5$, $(CH_3)_3\text{—}Si\text{—}OC_2H_5$, $(CH_3CH_2)_3\text{—}Si\text{—}OCH_3$, $(CH_3)_2\text{—}Si\text{—}(OCH_3)_2$, $(CH_3)_2\text{—}Si\text{—}(OC_2H_5)_2$, $(CH_3CH_2)_2\text{—}Si\text{—}(OC_2H_5)_2$, $(CH_3CH_2)_2\text{—}Si\text{—}(OCH_3)_2$, $Ph\text{-}Si(OC_2H_5)_3$, $C_{10}H_{21}\text{—}Si(OCH_3)_3$ The content of the hydrolysable silane compound (s4) in the mixture (M) is preferably from 0.05 to 5 mol, particularly preferably from 0.3 to 3 mol per 1 mol of the hydrolysable silane compound (s1). When the content is at least the lower limit value in the above range, embossing at an edge of the upper surface of partition walls may be suppressed. When it is at most the upper limit value, the ink repellency of the ink repellent agent (D1) is good.

<5> Hydrolysable Silane Compound (s5)

By using the hydrolysable silane compound (s5) in the negative photosensitive resin composition, curing at a lower exposure becomes possible. It is considered that a mercapto group in the hydrolysable silane compound (s5) has a chain transfer property and thus can readily be bonded to an ethylenic double bond, etc. of the above-mentioned alkali-soluble resin or alkali-soluble monomer (A) or in a case where the ink repellent agent (D1) has an ethylenic double bond, the ethylenic double bond of the ink repellent agent (D1) itself, thereby to accelerate photo-curing.

Further, the hydrolysable silane compound (s5) containing a mercapto group has a pKa of about 10 and is likely to be readily deprotonated i.e. dissociated in an alkaline solution. Here, pKa=−$\log_{10}$Ka, where Ka is the acid dissociation constant. Thus, the mercapto group is considered to increase the alkali solubility during the development of the negative photosensitive resin composition.

As the hydrolysable silane compound (s5), one type may be used alone, or two or more types may be used in combination.

As the hydrolysable group, the same one as the hydrolysable group in the hydrolysable silane compound (s1) may be employed.

As the hydrolysable silane compound (s5), a compound represented by the following formula (dx-5) is preferred.

$(HS\text{-}Q^5)_p\text{-}Si(R^{H5})_q X^5_{(4-p-q)}$ (dx-5)

The symbols in the formula (dx-5) have the following meanings.

$Q^5$ is a $C_{1-10}$ bivalent organic group containing no fluorine atom.

$R^{H5}$ is a $C_{1-6}$ hydrocarbon group.

$X^5$ is a hydrolysable group.

p is 1 or 2, and q is 0 or 1, provided that p+q is 1 or 2.

When a plurality of HS-$Q^5$ are present, they may be the same or different from one another.

When a plurality of $X^5$ are present, they may be the same or different from one another.

As $X^5$, the same group as the above $X^{11}$ and $X^{12}$ may be employed.

As $Q^5$, a $C_{1-10}$ alkylene group is preferred, a $C_{1-5}$ alkylene group is more preferred, and a $C_{1-3}$ alkylene group is particularly preferred.

As $R^{H5}$, the same group as the above $R^{H11}$ and $R^{H12}$ may be employed.

Specific examples of the compound (dx-5) may, for example, be HS—$(CH_2)_3$—Si$(OCH_3)_3$, HS—$(CH_2)_3$—Si$(CH_3)(OCH_3)_2$, etc.

The content of the hydrolysable silane compound (s5) in the mixture (M) is preferably from 0.125 to 18 mol, particularly preferably from 0.125 to 8 mol, per 1 mol of the hydrolysable silane compound (s1). When the content is at least the lower limit value in the above range, in the negative photosensitive resin composition, curing at a lower exposure becomes possible, and the alkali solubility is increased whereby the developing properties will be good. When it is at most the upper limit value, the ink repellency of the ink repellent agent (D1) is good.

<6> Other Hydrolysable Silane Compounds

The mixture (M) may optionally contain one or more hydrolysable silane compounds other than the hydrolysable silane compounds (s1) to (s5).

As such other hydrolysable silane compounds, hydrolysable silane compounds having an oxyalkylene group and a hydrolysable group and containing no fluorine atom, may be mentioned. Specifically, for example, $CH_3O(C_2H_4O)_k Si(OCH_3)_3$ (polyoxyethylene group-containing trimethoxysilanes) (wherein k is for example about 10) may be mentioned.

<7> Ink Repellent Agent (D1)

The ink repellent agent (D1) is a partially hydrolyzed condensate of the mixture (M). As an example of the ink repellent agent (D1), an average composition formula of an ink repellent agent (D11) is shown by the following formula (II), as a partially hydrolyzed condensate of the mixture (M) which contains the compound (dx-1a) and optionally contains the compounds (dx-2) to (dx-5) wherein the group T in the compound (dx-1a) is a fluorine atom.

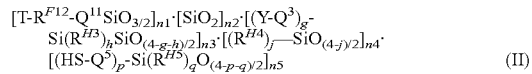

$[T\text{-}R^{F12}\text{-}Q^{11}SiO_{3/2}]_{n1}\cdot[SiO_2]_{n2}\cdot[(Y\text{-}Q^3)_g\text{-}Si(R^{H3})_h SiO_{(4-g-h)/2}]_{n3}\cdot[(R^{H4})_j\text{—}SiO_{(4-j)/2}]_{n4}\cdot[(HS\text{-}Q^5)_p\text{-}Si(R^{H5})_q O_{(4-p-q)/2}]_{n5}$ (II)

In the formula (II), n1 to n5 are molar fractions of the respective constituting units to the total molar amount of the constituting units. n1>0, n2≥0, n3≥0, n4≥0, n5≥0, and n1+n2+n3+n4+n5=1. Other symbols are as defined above, provided that T is a fluorine atom.

Here, the ink repellent agent (D11) is actually a formed product (partially hydrolyzed condensate) having hydrolysable groups or silanol groups remained, and such a formed product is hardly represented by a chemical formula.

The average composition formula represented by the formula (II) is a chemical formula in a case where it is assumed that in the ink repellent agent (D11), all of hydrolysable groups and silanol groups have become to be siloxane bonds.

Further, in the formula (II), units derived respectively from the compounds (dx-1a), (dx-2) to (dx-5) are assumed to be randomly arranged.

In the average composition formula represented by the formula (II), n1:n2:n3:n4:n5 agrees to the charged composition of the compounds (dx-1a), (dx-2) to (dx-5) in the mixture (M).

The molar ratios of the respective components will be designed from the balance of the effects of the respective components.

n1 is preferably from 0.02 to 0.4, particularly preferably from 0.02 to 0.3 in such an amount that the content of fluorine atoms in the ink repellent agent (D11) becomes to be within the above-mentioned preferred range.

n2 is preferably from 0 to 0.98, particularly preferably from 0.05 to 0.6.

n3 is preferably from 0 to 0.8, particularly preferably from 0.2 to 0.5.

n4 is preferably from 0 to 0.5, particularly preferably from 0.05 to 0.3.

n5 is preferably from 0 to 0.9, more preferably from 0.05 to 0.8, particularly preferably from 0.05 to 0.4.

Here, the above preferred molar ratios of the respective components similarly apply also to a case where T in the compound (dx-1a) is a group (Ib).

Further, the above preferred molar ratios of the respective components may similarly apply to a case where the mixture (M) contains the hydrolysable silane compound (s1) and optionally contains the hydrolysable silane compounds (s2) to (s5). That is, the preferred amounts of the hydrolysable silane compounds (s1) to (s5) to be charged in the mixture (M) in order to obtain the ink repellent agent (D1) correspond, respectively, to the above preferred ranges of n1 to n5.

The mass average molecular weight (Mw) of the ink repellent agent (D1) is preferably at least 500, preferably less than 1,000,000, particularly preferably less than 10,000.

When the mass average molecular weight (Mw) is at least the lower limit value, the ink repellent agent (D1) tends to migrate to the upper surface at the time of forming a cured film by using the negative photosensitive resin composition. When it is less than the upper limit value, the solubility of the ink repellent agent (D1) in a solvent will be good.

The mass average molecular weight (Mw) of the ink repellent agent (D1) can be adjusted by the production conditions.

The ink repellent agent (D1) may be produced by subjecting the above-described mixture (M) to hydrolysis and condensation reaction by a known method.

For this reaction, it is preferred to use, as a catalyst, an inorganic acid such as hydrochloric acid, sulfuric acid, nitric acid or phosphoric acid, or an organic acid such as acetic acid, oxalic acid or maleic acid, which is commonly used. Further, as the case requires, an alkali catalyst such as sodium hydroxide or tetramethyl ammonium hydroxide (TMAH) may be used.

In the above reaction, a known solvent may be employed.

The ink repellent agent (D1) obtainable by the above reaction may be incorporated to the negative photosensitive resin composition in a liquid state together with a solvent.

<Ink Repellent Agent (D2)>

The ink repellent agent (D2) is a compound, of which the main chain is a hydrocarbon chain and which contains a side chain having fluorine atoms. The mass average molecular weight (Mw) of the ink repellent agent (D2) is preferably from 100 to 1,000,000, particularly preferably from 5,000 to 100,000. When the mass average molecular weight (Mw) is at least the lower limit value, the ink repellent agent (D2) tends to migrate to the upper surface at the time of forming a cured film by using the negative photosensitive resin composition. When it is less than the upper limit value, the solubility of the ink repellent agent (D2) in a solvent will be good.

The ink repellent agent (D2) is preferably a polymer containing a fluoroalkyl group which may contain an etheric oxygen atom and/or a side chain having a fluoroalkyl group which may contain an etheric oxygen atom.

The fluoroalkyl group may be linear or branched.

The following structures may be mentioned as specific examples of the fluoroalkyl group having no etheric oxygen atom.

—$CF_3$, —$CF_2CF_3$, —$CF_2CHF_2$, —$(CF_2)_2CF_3$, —$(CF_2)_3CF_3$, —$(CF_2)_4CF_3$, —$(CF_2)_5CF_3$, —$(CF_2)_6CF_3$, —$(CF_2)_7CF_3$, —$(CF_2)_8CF_3$, —$(CF_2)_9CF_3$, —$(CF_2)_{11}CF_3$, —$(CF_2)_{15}CF_3$.

The following structures may be mentioned as specific examples of the fluoroalkyl group containing an etheric oxygen atom.

—$CF(CF_3)O(CF_2)_5CF_3$,
—$CF_2O(CF_2CF_2O)_{r1}CF_3$,
—$CF(CF_3)O(CF_2CF(CF_3)O)_{r2}C_6F_{13}$, and
—$CF(CF_3)O(CF_2CF(CF_3)O)_{r3}C_3F_7$.

In the above formulae, r1 is an integer of from 1 to 8, r2 is an integer of from 1 to 4, and r3 is an integer of from 1 to 5.

The fluoroalkyl group is preferably a perfluoroalkyl group, whereby the ink repellency will be good.

The number of carbon atoms in the fluoroalkyl group is preferably from 4 to 15, more preferably from 4 to 12. When the number of carbon atoms in the fluoroalkyl group is from 4 to 15, the ink repellency will be excellent, and at the time of producing the ink repellent agent (D2), compatibility between the monomer having the fluoroalkyl group and the after-described monomers other than such monomer will be good.

The ink repellent agent (D2) is preferably a polymer having polymerized units containing fluoroalkyl groups. It is preferred to introduce the polymerized units containing fluoroalkyl groups to a polymer by polymerizing a polymerizable monomer having a fluoroalkyl group. Otherwise, fluoroalkyl groups may be introduced to a polymer by various modification methods wherein a polymer having reactive sites is reacted with an optional compound.

The hydrocarbon chain constituting the main chain of the ink repellent agent (D2) may, specifically, be a main chain obtainable by polymerization of a monomer having an ethylenic double bond, or a novolac type main chain composed of repeating units of -Ph-$CH_2$— (wherein Ph is a benzene skeleton).

In order to obtain the ink repellent agent (D2) by polymerization of a monomer having an ethylenic double bond, a monomer having a fluoroalkyl group as well as an ethylenic double bond may be polymerized alone, or, as the case requires, together with other monomer having an ethylenic double bond.

Now, a case where the main chain of the ink repellent agent (D2) is a main chain obtainable by polymerization of a monomer having an ethylenic double bond, will be described.

The monomer having a fluoroalkyl group as well as an ethylenic double bond, may, for example, be $CH_2=CR^4COOR^5R^f$, $CH_2=CR^4COOR^6NR^4SO_2R^f$, $CH_2=CR^4COOR^6NR^4COR^f$, $CH_2=CR^4COOCH_2CH(OH)R^5R^f$ or $CH_2=CR^4CR^4=CFR^f$.

In the above formulae, $R^f$ is a fluoroalkyl group, $R^4$ is a hydrogen atom, a halogen atom other than a fluorine atom, or a methyl group, $R^5$ is a single bond or a $C_{1-6}$ bivalent organic group, and $R^6$ is a $C_{1-6}$ bivalent organic group. Preferred embodiments of the fluoroalkyl group as $R^f$ are as mentioned above. The halogen atom as $R^4$ is preferably a chlorine atom.

Specific examples of $R^5$ or $R^6$ may be $-CH_2-$, $-CH_2CH_2-$, $-CH(CH_3)-$, $-CH_2CH_2CH_2-$, $-CH(CH_3)_2-$, $-CH(CH_2CH_3)-$, $-CH_2CH_2CH_2CH_2-$, $-CH(CH_2CH_2CH_3)-$, $-CH_2(CH_2)_3CH_2-$ and $-CH(CH_2CH(CH_3)_2)-$.

As the above polymerizable monomer, one type may be used alone, or two or more types may be used in combination.

The ink repellent agent (D2) is preferably a polymer containing a side chain having an acidic group, whereby alkali-solubility will be good.

Here, the acidic group may be contained in a side chain having a fluoroalkyl group. Otherwise, there may be a side chain containing an acidic group and having no fluoroalkyl group, separately from the side chain having a fluoroalkyl group.

As the acidic group, preferred is at least one member selected from the group consisting of a carboxy group, a phenolic hydroxy group and a sulfo group, or its salt.

The ink repellent agent (D2) is preferably a polymer containing a side chain having an ethylenic double bond, whereby it has a photo-crosslinkable properties and can bond to each other or to other component having an ethylenic double bond contained in a negative photosensitive resin composition at the upper layer portion of a cured film in the process for producing the cured film by curing the negative photosensitive resin composition, so that the fixing properties of the ink repellent agent (D) can be improved.

A polymer containing at least two ethylenic double bonds in one side chain is particularly preferred.

Further, an ethylenic double bond may be contained in a side chain having a fluoroalkyl group. Otherwise, there may be a side chain containing an ethylenic double bond and having no fluoroalkyl group, separately from a side chain having a fluoroalkyl group. As the group having an ethylenic double bond, a (meth)acryloyloxy group and a vinyl phenyl group are preferred, and a (meth)acryloyloxy group is particularly preferred.

The ink repellent agent (D2) may be a polymer containing a side chain having an oxyalkylene group. The oxyalkylene group may be contained in the form of a polyoxyalkylene chain (POA chain) having a plurality of oxyalkylene groups linked to one another.

Although the oxyalkylene group itself does not have photo-crosslinkable properties, the ink repellent agent (D2) having an oxyalkylene group can bond to each other or to other component contained in a negative photosensitive resin composition in the upper layer in the process for producing a cured film, so that the fixing properties of the ink repellent agent (D2) can be improved, in the same manner as in the case of having an ethylenic double bond. The oxyalkylene group has hydrophilicity and thus has an effect to increase wettability to the developer.

Here, the oxyalkylene group may be contained in a side chain having a fluoroalkyl group. Otherwise, there may be a side chain containing an oxyalkylene group and having no fluoroalkyl group, separately from a side chain having a fluoroalkyl group.

The ink repellent agent (D2) may contain at least one side chain among a side chain having an acidic group, a side chain having an ethylenic double bond and a side chain having an oxyalkylene group. In one side chain, at least two types among an acidic group, an ethylenic double bond and an oxyalkylene group, may be contained.

The ink repellent agent (D2) may contain a side chain having an optional group, other than a side chain having an acidic group, a side chain having an ethylenic double bond and a side chain having an oxyalkylene group.

A method for introducing a side chain having an acidic group and not having a fluoroalkyl group, is preferably a method wherein a monomer having a fluoroalkyl group and a monomer having an acidic group and not having a fluoroalkyl group are copolymerized. Otherwise, an acidic group may be introduced to a polymer by various modifying methods to react a polymer having reactive sites with an optional compound.

As the monomer having a carboxy group, (meth)acrylic acid, vinyl acetic acid, crotonic acid, itaconic acid, maleic acid, fumaric acid, cinnamic acid and their salts may be mentioned. They may be used alone, or two or more of them may be used in combination.

As the monomer having a phenolic hydroxy group, o-hydroxystyrene, m-hydroxystyrene and p-hydroxystyrene may be mentioned. Further, such compounds may be mentioned wherein at least one hydrogen atom in such benzene rings is substituted by an alkyl group such as methyl, ethyl or n-butyl, an alkoxy group such as methoxy, ethoxy or n-butoxy, a halogen atom, a haloalkyl group having at least one hydrogen atom in an alkyl group substituted by a halogen atom, a nitro group, a cyano group, or an amide group.

As the monomer having a sulfo group, vinyl sulfonic acid, styrenesulfonic acid, (meth)allylsulfonic acid, 2-hydroxy-3-(meth)allyloxypropane sulfonic acid, 2-sulfoethyl (meth)acrylate, 2-sulfopropyl (meth)acrylate, 2-hydroxy-3-(meth)acryloxypropane sulfonic acid, 2-(meth)acrylamido-2-methylpropane sulfonic acid, and their salts, may be mentioned.

The method for introducing a carboxy group to a polymer by various modifying methods to react a polymer having reactive sites with an optional compound, may, for example, be (1) a method wherein a monomer having a hydroxy group is preliminarily copolymerized, and then reacted with an acid anhydride, or (2) a method wherein an acid anhydride having an ethylenic double bond is preliminarily copolymerized and then reacted with a compound having a hydroxy group.

Specific examples of the monomer having a hydroxy group may be 2-hydroxyethyl (meth)acrylate, 2-hydroxypropyl (meth)acrylate, 3-hydroxypropyl (meth)acrylate, 4-hydroxybutyl (meth)acrylate, 5-hydroxypentyl (meth)acrylate, 6-hydroxyhexyl (meth)acrylate, 4-hydroxycyclohexyl (meth)acrylate, neopentyl glycol mono(meth)acrylate, 3-chloro-2-hydroxypropyl (meth)acrylate, glycerol mono(meth)acrylate, 2-hydroxyethyl vinyl ether, 4-hydroxybutyl vinyl ether, cyclohexanediol monovinyl ether, 2-hydroxyethyl allyl ether, N-hydroxymethyl (meth)acrylamide and N,N-bis(hydroxymethyl) (meth)acrylamide. They may be used alone, or two or more of them may be used in combination.

The monomer having a hydroxyl group may be a monomer having a polyoxyalkylene chain (POA chain) with a hydroxy group at its terminal.

For example, $CH_2=CHOCH_2C_6H_{10}CH_2O(C_2H_4O)_{k1}H$, $CH_2=CHOC_4H_8O(C_2H_4O)_{k1}H$, $CH_2=CHCOOC_2H_4O(C_2H_4O)_{k1}H$, $CH_2=C(CH_3)COOC_2H_4O(C_2H_4O)_{k1}H$, $CH_2=CHCOOC_2H_4O(C_2H_4O)_{k2}(C_3H_6O)_{k3}H$ and $CH_2=C(CH_3)COOC_2H_4O(C_2H_4O)_{k2}(C_3H_6O)_{k3}H$ may be mentioned. They may be used alone, or two or more of them may be used in combination.

In the above formulae, k1 is an integer of from 1 to 100, k2 is an integer of from 0 to 100, and k3 is an integer of from 1 to 100, provided that k2+k3 is from 1 to 100.

The acid anhydride may be an acid anhydride of a compound having at least two carboxy groups in one molecule. Pivalic anhydride and trimellitic anhydride may be mentioned. Further, an acid anhydride having an ethylenic double bond, such as maleic anhydride, itaconic anhydride, citraconic anhydride, phthalic anhydride, 3-methylphthalic anhydride, methyl-5-norbornene-2,3-dicarboxylic anhydride, 3,4,5,6-tetrahydrophthalic anhydride, cis-1,2,3,6-tetrahydrophthalic anhydride or 2-buten-1-ylsuccinic anhydride, may be mentioned. These may be used alone, or two or more of them may be used in combination.

The compound having a hydroxy group may be a compound having at least one hydroxy group, and the above-mentioned specific examples of the monomer having a hydroxy group, an alcohol such as ethanol, 1-propanol, 2-propanol, 1-butanol or ethylene glycol, a cellosolve such as 2-methoxyethanol, 2-ethoxyethanol or 2-butoxyethanol, and a carbitol such as 2-(2-methoxyethoxyl)ethanol, 2-(2-ethoxyethoxyl)ethanol or 2-(2-butoxyethoxyl)ethanol, may, for example, be mentioned. Among them, a compound having one hydroxy group in its molecule is preferred. These may be used alone, or two or more of them may be used in combination.

By the above method, it is possible to introduce a side chain containing an acidic group, a side chain containing an acidic group and an ethylenic double bond, or a side chain containing an acidic group and an oxyalkylene group.

It is also possible to use a monomer not containing a hydroxyl group and an acidic group and having a polyoxyalkylene chain (POA chain), e.g. a monomer represented by the following formula (POA-1) or (POA-2).

$$CH_2=CR^{71}-COO-W-(R^{72}-O)_{k4}-R^{73} \quad \text{(POA-1)}$$

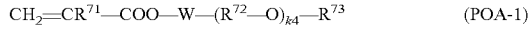

$$CH_2=CR^{71}-O-W-(R^{72}-O)_{k4}-R^{73} \quad \text{(POA-2)}$$

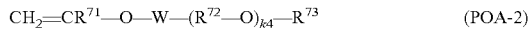

(wherein $R^{71}$ is a hydrogen atom, a chlorine atom, a bromine atom, an iodine atom, a cyano group, a $C_{1-20}$ alkyl group, a $C_{7-20}$ alkyl group substituted by an aryl group, a $C_{6-20}$ aryl group or a $C_{3-20}$ cycloalkyl group, $R^{72}$ is a $C_{1-5}$ alkylene group, $R^{73}$ is a $C_{1-4}$ alkyl group, W is a single bond or a $C_{1-10}$ bivalent organic group having no fluorine atom, and k4 is an integer of from 6 to 30.).

Otherwise, by suitably selecting known monomers and reactions depending upon the desired composition, it is possible to obtain an ink repellent agent (D2) as a polymer which contains one or more side chains among a side chain having an acidic group, a side chain having an ethylenic double bond and a side chain having an oxyalkylene group, and which contains a side chain having fluorine atoms, preferably a fluoroalkyl group which may contain an etheric oxygen atom, and/or a side chain having a fluoroalkyl group which may contain an etheric oxygen atom.

Here, in such a case, it is preferred to suitably adjust the blend proportions of the monomers to be used, so that the content of fluorine atoms in the ink repellent agent (D2) will be in the above-mentioned preferred range.

In a case where the main chain of the ink repellent agent (D2) is a novolac type main chain composed of repeating units of -Ph-$CH_2$—, usually, a polymer wherein a benzene skeleton (Ph) constituting the main chain, has a side chain with fluorine atoms, and optionally has a group with an acidic group, a group with an ethylenic double bond and an oxyalkylene group bonded thereto, is employed as the ink repellent agent (D2).

The above side chain with fluorine atoms is preferably a fluoroalkyl group which may have an etheric oxygen atom and/or a side chain having a fluoroalkyl group which may have an etheric oxygen atom. With respect to the acidic group, the group having an ethylenic double bond and the oxyalkylene group, the same ones as in the above described case of the ink repellent agent (D2) having a main chain obtainable by polymerization of a monomer having an ethylenic double bond, may be mentioned.

Also in this case, it is preferred to design the molecule of the ink repellent agent (D2) so that the content of fluorine atoms in the ink repellent agent (D2) will be within the above-mentioned preferred range.

Such an ink repellent agent (D2) may be produced by polymerizing a monomer having the above-mentioned respective groups preliminarily introduced to a benzene skeleton, or after obtaining a polymer having reactive sites, specifically hydroxy groups, amino groups, mercapto groups, sulfonic groups, carboxylic groups, carbonyl groups, ethylenic double bonds, etc., the above-mentioned respective groups may be introduced to the polymer by a modifying method of reacting suitable compounds to the reactive sites.

The content of the ink repellent agent (D) in the total solid content in the negative photosensitive resin composition is preferably from 0.01 to 15 mass %, more preferably from 0.01 to 5 mass %, particularly preferably from 0.03 to 1.5 mass %. When the content is at least the lower limit value in the above range, the upper surface of a cured film to be formed from the negative photosensitive resin composition will have excellent ink repellency. When it is at most the upper limit value in the above range, the adhesion between the cured film and the substrate will be good.

(Cross-Linking Agent (E))

The cross-linking agent (E) to be optionally contained in the negative photosensitive resin composition of the present invention is a compound having at least 2 ethylenic double bonds per molecule and having no acidic group. When the negative photosensitive resin composition contains the cross-linking agent (E), the curability of the negative photosensitive resin composition at the time of exposure will be improved, and it becomes possible to form a cured film even at a low exposure amount.

As the cross-linking agent (E), diethylene glycol di(meth)acrylate, trimethylolpropane tri(meth)acrylate, pentaerythritol tri(meth)acrylate, pentaerythritol tetra(meth)acrylate, ditrimethylolpropane tetra(meth)acrylate, dipentaerythritol penta(meth)acrylate, dipentaerythritol hexa(meth)acrylate, ethoxylated isocyanuric acid tri(meth)acrylate, tris-(2-acryloxyethyl) isocyanurate, ε-caprolactone-modified tris-(2-acryloxyethyl) isocyanurate and urethane acrylate may, for example, be mentioned.

From the viewpoint of optical reactivity, it is preferred to have many ethylenic double bonds. For example, pentaerythritol tetra(meth)acrylate, ditrimethylolpropane tetra(meth)acrylate, dipentaerythritol hexa(meth)acrylate, dipentaerythritol penta(meth)acrylate, ethoxylated isocyanuric acid tri(meth)acrylate and urethane acrylate are preferred.

As the cross-linking agent (E), one type may be used alone, or two or more types may be used in combination.

The content of the cross-linking agent (E) in the total solid content in the negative photosensitive resin composition is preferably from 10 to 60 mass %, particularly preferably from 20 to 55 mass %.

(Solvent (F))

When the negative photosensitive resin composition of the present invention contains a solvent (F), the viscosity is reduced, and application of the negative photosensitive resin composition to a substrate surface becomes easy. As a result, it is possible to form a coating film of the negative photosensitive resin composition having a uniform film thickness.

As the solvent (F), a known solvent may be used. As the solvent (F), one type may be used alone, or two or more types may be used in combination.

As the solvent (F), alkylene glycol alkyl ethers, alkylene glycol alkyl ether acetates, alcohols, solvent naphthas, etc. may be mentioned. Among them, at least one solvent selected from the group consisting of alkylene glycol alkyl ethers, alkylene glycol alkyl ether acetates and alcohols is preferred, and at least one solvent selected from the group consisting of propylene glycol monomethyl ether acetate, propylene glycol monomethyl ether, diethylene glycol ethylmethyl ether and 2-propanol is more preferred.

The content of the solvent (F) in the negative photosensitive resin composition is preferably from 50 to 99 mass %, more preferably from 60 to 95 mass %, particularly preferably from 65 to 90 mass %, to the total amount of the composition.

(Colorant (G))

The negative photosensitive resin composition of the present invention may contain a colorant (G) in order to impart light shielding properties to a curd film, particularly to partition walls, depending upon the particular application.

As the colorant (G), carbon black, aniline black, anthraquinone-type black pigment, perylene-type black pigment, etc., may be mentioned. Specifically C.I. pigment black 1, 6, 7, 12, 20, 31, etc., may be mentioned. It is also possible to use a mixture of organic pigments and/or inorganic pigments such as red pigments, blue pigments and green pigments.

As the colorant (G), one type may be used alone, or two or more types may be used in combination.

In a case where the negative photosensitive resin composition of the present invention contains the colorant (G), the content of the colorant (G) in the total solid content is preferably from 15 to 65 mass %, particularly preferably from 20 to 50 mass %. Within such a range, the obtainable negative photosensitive resin composition will have good sensitivity, and partition walls to be formed will be excellent in light-shielding properties.

(Other Components) The negative photosensitive resin composition in the present invention may further contain one or more of other additives such as a thermal cross-linking agent, a polymer dispersant, a dispersion assistant, a silane coupling agent, fine particles, a phosphoric acid compound, a curing accelerator, a thickener, a plasticizer, a defoaming agent, a leveling agent, a cissing preventive agent and an ultraviolet absorber, as the case requires.

The negative photosensitive resin composition of the present invention is obtained by mixing prescribed amounts of the above-described respective components.

By using the negative photosensitive resin composition of the present invention, it is possible to form a cured resin film, particularly partition walls, having good ink repellency on the upper surface. Most of the ink repellent agent (D) is sufficiently fixed to the ink repellent layer, and even the ink repellent agent (D) present at a low concentration in the partition walls at a portion lower than the ink repellent layer is hardly migrate to the opening sections where the ink repellent agent (D) is surrounded by the partition walls at the time of development since the partition walls are sufficiently photo-cured. That is, by using the negative photosensitive resin composition of the present invention, opening sections where the ink can uniformly be applied can be obtained.

Cured Resin Film and Partition Walls in Second Embodiment

The cured resin film in the second embodiment of the present invention is formed by using the above-described negative photosensitive resin composition of the present invention. The cured resin film in the second embodiment of the present invention may be obtained, for example, by applying the negative photosensitive resin composition of the present invention on the surface of a base material such as a substrate, and drying it to remove a solvent, etc., as the case requires, followed by exposure for curing.

The cured resin film to be formed on a substrate by using the negative photosensitive resin composition of the present invention is a cured resin film within the scope of the cured resin film in the first embodiment of the present invention which has the characteristics (I) and (II) as a characteristic of the superficial layer including the surface, in the composition analyses by means of XPS.

The partition walls of the present invention are partition walls made of the above-described cured resin film of the present invention, formed in a form to partition the substrate surface into a plurality of compartments for forming dots. The partition walls are obtained, for example, in such a manner that in the above-described production of a cured resin film, portions to become compartments for forming dots are masked before exposure, followed by exposure and then by development. By the development, the masked non-exposed portions are removed, whereby opening sections corresponding to the compartments for forming dots are formed together with partition walls.

Now, an example of the method for producing partition walls in an embodiment of the present invention will be described with reference to FIGS. 3A to 3D, but the method for producing partition walls is by no means limited to the following.

Here, the following production method will be described as one wherein the negative photosensitive resin composition contains a solvent (F).

Figure 3A:
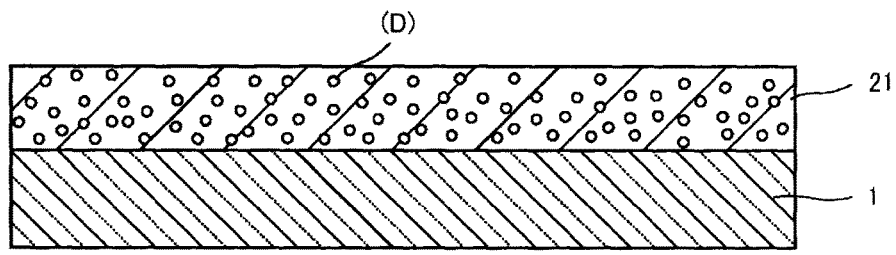
FIG. 3A is a process chart schematically illustrating a method for producing partition walls in an embodiment of the present invention.

As shown in FIG. 3A, the negative photosensitive resin composition is applied over the entire main surface on one side of a substrate 1 to form a coating film 21. At that time, in the coating film 21, an ink repellent agent (D) are wholly dissolved and uniformly dispersed. Here, in FIG. 3A, the ink repellent agent (D) is schematically shown, and in reality, they are not present in the form of such particles.

Figure 3B:
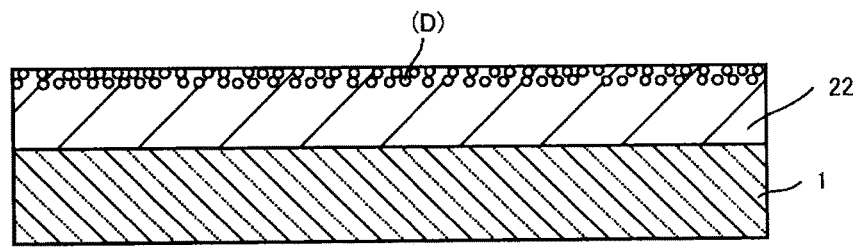
FIG. 3B is a process chart schematically illustrating a method for producing partition walls in an embodiment of the present invention.

Then, as shown in FIG. 3B, the coating film 21 is dried to form a dried film 22. The drying method may, for example, be heat drying, vacuum drying, vacuum heat drying, etc. In the case of heat drying, the heating temperature is preferably from 50 to 120° C., more preferably from 70 to 120° C., although it may depend on the type of the solvent (F).

During this drying process, the ink repellent agent (D) will migrate to the upper layer portion of the dried film. Here, even in a case where the negative photosensitive resin composition does not contain a solvent (F), the upward migration of the ink repellent agent (D) in the coating film will be accomplished in the same manner.

Figure 3C:
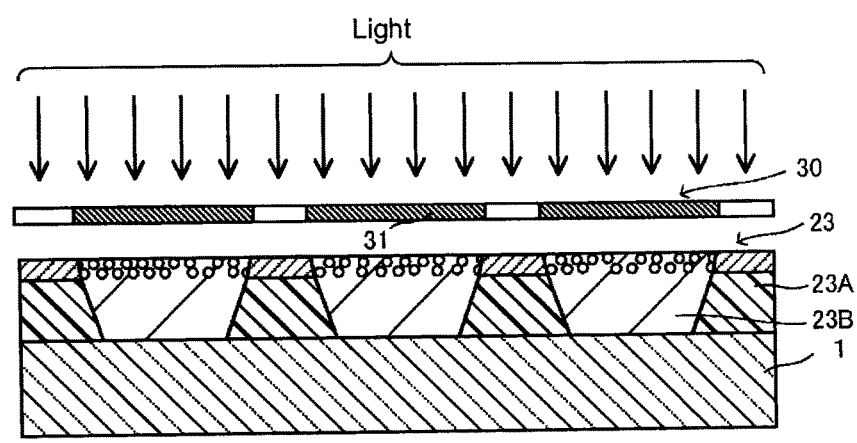
FIG. 3C is a process chart schematically illustrating a method for producing partition walls in an embodiment of the present invention.

Then, as shown in FIG. 3C, light is applied to the dried film 22 for exposure via a photomask 30 having masking portions 31 in a form corresponding to opening sections partitioned by partition walls. The film after exposure of the dried film 22 will be referred to as an exposed film 23. In the exposed film 23, exposed portions 23A are photo-cured, and non-exposed portions 23B are in the same state as the dried film 22.

The light for irradiation may, for example, be visible light; ultraviolet light; far ultraviolet light; excimer laser light such as KrF excimer laser light, ArF excimer laser light, $F_2$ excimer laser light, $Kr_2$ excimer laser light, KrAr excimer laser light or $Ar_2$ excimer laser light; X-rays; electron rays; etc.

As the light for irradiation, light with a wavelength of from 100 to 600 nm is preferred, light with a wavelength of from 300 to 500 nm is more preferred, and light including i-line (365 nm), h-line (405 nm) or g-line (436 nm) is particularly preferred. Further, as the case requires, light of 330 nm or less may be cut.

The exposure system may be whole surface integrated exposure or scanning exposure. Or, the same portion may be exposed plural times, and in such a case, the exposure conditions for the plural times may be the same or different.

In each of such exposure systems, the exposure amount may, for example, be preferably from 5 to 1,000 $mJ/cm^2$, more preferably from 5 to 500 $mJ/cm^2$, further preferably from 5 to 300 $mJ/cm^2$, particularly preferably from 5 to 200 $mJ/cm^2$, most preferably from 5 to 50 $mJ/cm^2$. Here, the exposure amount is optimized depending upon the wavelength of light to be applied, the composition of the negative photosensitive resin composition, the thickness of the coating film, etc.

The exposure time per unit area is not particularly limited and may be designed from the exposure power of the exposure apparatus to be used and the necessary exposure amount, etc. Here, in the case of scanning exposure, the exposure time may be determined from the scanning speed of light.

The exposure time per unit area is usually from about 0.01 to 60 seconds, preferably from 0.1 to 30 seconds.

Figure 3D:
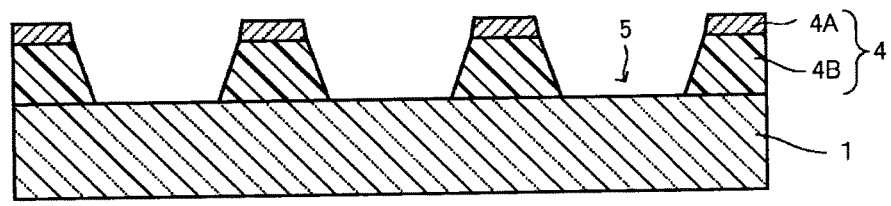
FIG. 3D is a process chart schematically illustrating a method for producing partition walls in an embodiment of the present invention.

Then, as shown in FIG. 3D, development by using an alkaline developer is carried out to form partition walls 4 made solely of portions corresponding to exposed portions 23A of the exposed film 23. Opening sections 5 partitioned by partition walls 4 are areas where non-exposed portions 23B were present in the exposed film 23, and FIG. 3D shows the state after the non-exposed portions 23B have been removed by development. The non-exposed portions 23B are dissolved and removed by the alkaline developer in such a state that, as described above, the ink repellent agent (D) has migrated to the upper layer so that the ink repellent agent (D) is no longer substantially present in the lower layer thereof, and therefore, the ink repellent agent (D) does not substantially remain in the opening sections 5.

Here, in the partition walls 4 shown in FIG. 3D, the uppermost layer including the upper surface is an ink repellent layer 4A. In a case where the ink repellent agent (D) does not have a side chain with an ethylenic double bond, the ink repellent agent (D) remains in the uppermost layer at a high concentration to form an ink repellent layer at the time of exposure. At the time of exposure, the alkali-soluble resin or alkali-soluble monomer (A) and the thiol compound (C) and further other photocurable component optionally contained, present around the ink repellent agent (D), are strongly photo-cured, whereby the ink repellent agent (D) is fixed to the ink repellent layer.

In a case where the ink repellent agent (D) has a side chain with an ethylenic double bond, the ink repellent agent (D) is photo-cured to each other and/or together with the alkali-soluble resin or alkali-soluble monomer (A), the thiol compound (C), other photocurable component, etc., thereby to form an ink repellent layer 4A in which the ink repellent agent (D) is strongly bonded.

In either of the above cases, in the lower side of the ink repellent layer 4A, a layer 4B containing substantially no ink repellent agent (D) is formed by photo-curing of mainly the alkali-soluble resin or alkali-soluble monomer (A) and the thiol compound (C) and further photocurable component optionally contained.

As described above, the ink repellent agent (D) is sufficiently fixed to partition walls including the ink repellent layer 4A and the lower layer 4B thereof, and accordingly it hardly migrate to the opening sections at the time of development.

After the development, the partition walls 4 may further be heated. The heating temperature is preferably from 130 to 250° C., more preferably from 150 to 240° C. By the heating, curing of the partition walls 4 will be further strengthened. Further, the ink repellent agent (D) will be more firmly fixed in the ink repellent layer 4A.

The cured resin film and partition walls 4 of the present invention thus obtainable, have good ink repellency at the upper surface even when the exposure is carried out at a low exposure amount. Further, with the partition walls 4, the ink repellent agent (D) will not substantially be present in the opening sections 5 after the development, and thus, it is possible to sufficiently secure uniform coating properties of ink at the opening sections 5.

Further, an ultraviolet/ozone treatment may be applied to the substrate 1 provided with the partition walls 4, so as to remove the development residue, etc. of the negative photosensitive resin composition which may remain in the opening sections 5 after the above heating, for the purpose of more securely obtaining ink-philicity of the opening sections 5.

The partition walls to be formed from the negative photosensitive resin composition of the present invention have, for example, a width of preferably at most 100 μm, particularly preferably at most 60 μm, most preferably from 5 to 50 μm.

Further, the distance (the pattern width) between the adjacent partition walls is preferably at most 300 μm, particularly preferably at most 250 μm, most preferably from 3 to 200 μm. The height of the partition walls is preferably from 0.05 to 50 μm, particularly preferably from 0.2 to 10 μm.

At the time of carrying out pattern printing by an IJ method, the partition walls of the present invention are useful as partition walls to define the opening sections to be ink injection regions. If the partition walls of the present invention are formed and used so that the opening sections correspond to desired ink injection regions at the time of carrying out pattern printing by an IJ method, since the upper surface of the partition walls has good ink repellency, it is possible to prevent the ink from being injected beyond the partition walls to undesired opening sections. Further, the opening sections defined by the partition walls have good wet-spreadability of ink, whereby it becomes possible to uniformly print the ink at the desired regions without white spots, etc.

By using the partition walls of the present invention, as mentioned above, pattern printing by an IJ method can be exquisitely carried out. Thus, the partition walls of the present invention are useful as partition walls of an optical element having partition walls located between a plurality of dots and their adjacent dots on a substrate surface, on which the dots are formed by an IJ method.

[Optical Element]

The optical element of the present invention is an optical element having the partition walls of the present invention located between a plurality of dots and their adjacent dots on a substrate surface. In the optical element of the present invention, the dots are preferably formed by an IJ method.

Now, an optical element in an embodiment of the present invention will be described with reference to a case where it is produced by an IJ method. However, the method for producing the optical element of the present invention is not limited to the following one.

Figure 4A:
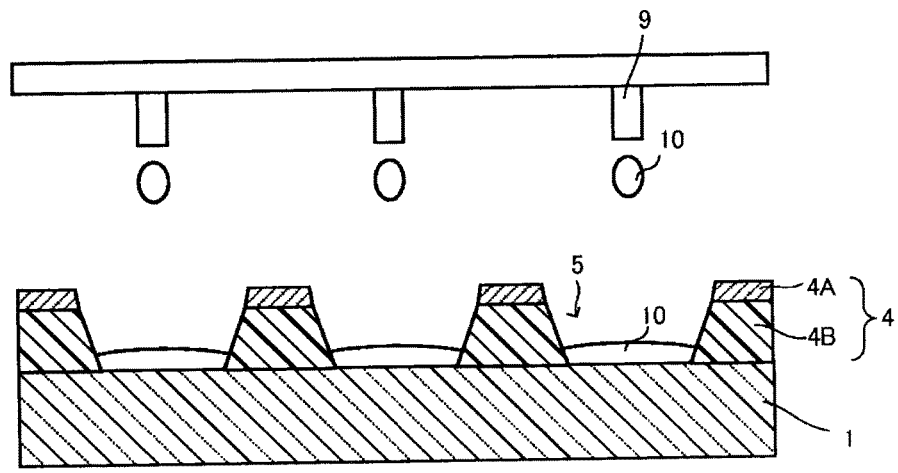
FIG. 4A is a process chart schematically illustrating a method for producing an optical element in an embodiment of the present invention.
Figure 4B:
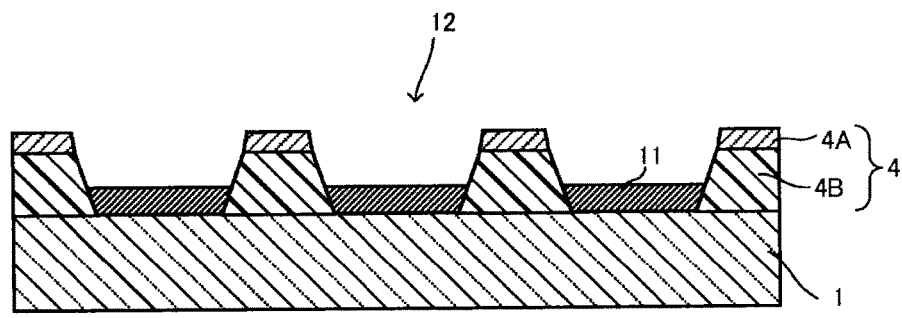
FIG. 4B is a process chart schematically illustrating a method for producing an optical element in an embodiment of the present invention.

FIGS. 4A to 4B schematically illustrate a method for producing an optical element by using the partition walls 4 formed on a substrate 1 as shown in the above-described FIG. 3D. Here, the partition walls 4 formed on a substrate 1 are ones formed so that opening sections 5 would agree to the pattern of dots of the optical element to be produced.

As shown in FIG. 4A, an ink 10 is dropped from an inkjet head 9 into opening sections 5 defined by partition walls 4 so that a predetermined amount of the ink 10 is injected into the opening sections 5. As the ink, an ink known for an optical element is suitably selected for use to meet the functions of dots.

Then, depending upon the type of the ink 10 used, for example, removal of a solvent, or for curing, treatment such as drying and/or heating, etc. may be applied to obtain, as shown in FIG. 4B, an optical element 12 having desired dots 11 formed in a form being adjacent to the partition walls 4.

The optical element of the present invention employs the partition walls of the present invention, whereby an ink can uniformly wet-spread without unevenness in opening sections partitioned by the partition walls during the process for its production, and thus is an optical element having dots formed with high precision.

As the optical element, an organic EL element, a color filter of a liquid crystal element, an organic TFT array element, etc. may be mentioned.

The organic TFT array element is an element wherein a plurality of dots are arranged in a planar view matrix form, each dot is provided with image electrodes and TFT as a switching element to drive them, and an organic semiconductor layer is used as a semiconductor layer including a channel layer of TFT.

The organic TFT array element is used as a TFT array substrate for e.g. an organic EL element or a liquid crystal element.

The organic EL element may be produced, for example, as follows.

On a light transmitting substrate of e.g. glass, a light transmitting electrode of e.g. tin-doped indium oxide (ITO) is deposited by e.g. a sputtering method. As the case requires, this light transmitting electrode may be subjected to patterning.

Then, using the negative photosensitive resin composition of the present invention, partition walls are formed in a planar view lattice form along outlines of respective dots, by a photolithography method including coating, exposure and development.

Then, into the dots, by an IJ method, materials for a hole injection layer, a hole transport layer, a luminescent layer, a hole blocking layer and an electron injection layer are respectively applied and dried to sequentially laminate these layers. The types and number of organic layers to be formed in the dots are suitably designed.

Finally, a reflecting electrode of e.g. aluminum is formed by e.g. a vapor deposition method.

EXAMPLES

Now, the present invention will be described with reference to Examples, but it should be understood that the present invention is by no means thereby limited. Ex. 1 to 21 are Examples of the present invention, and Ex. 31 to 33 are Comparative Examples.

The respective measurements were conducted by the following methods.

[Number Average Molecular Weight (Mn), Mass Average Molecular Weight (Mw)]

A number average molecular weight (Mn) and a mass average molecular weight (Mw) were measured by a gel permeation chromatography method using polystyrene as the standard substance. As gel permeation chromatography, HPLC-8220GPC (manufactured by Tosoh Corporation) was used. As the column, one having three columns of shodex LF-604 connected, was used. As the detector, a RI (refractive index) detector was used. As the standard substance, EasiCal PS1 (manufactured by Polymer Laboratories Ltd.) was used. Further, at the time of measuring a number average molecular weight and a mass average molecular weight, the column was held at 37° C., tetrahydrofuran was used as the eluent, the flow rate was adjusted to be 0.2 mL/min., and 40 μL of a 0.5 mass % tetrahydrofuran solution of a sample to be measured, was injected.

[Content of Fluorine Atoms]

The content of fluorine atoms was calculated by $^{19}$F NMR measurement using 1,4-ditrifluoromethylbenzene as the standard substance.

[Content of Ethylenic Double Bonds (C=C)]

The content of ethylenic double bonds was calculated from the blend proportions of raw materials.

[Acid Value]

The acid value was theoretically calculated from the blend proportions of raw materials.

Abbreviations of compounds used in the following Examples are shown below.

(Alkali-Soluble Resin (AP))

Alkali-soluble resin (A1) composition: A composition (solid content: 70 mass %, solvent naphtha: 30 mass %) of a resin (alkali-soluble resin (A1), acid value: 60 mgKOH/g) obtained by purifying with hexane a resin having acryloyl groups and carboxy groups introduced by reacting a cresol novolac-type epoxy resin with acrylic acid and then with 1,2,3,6-tetrahydrophthalic anhydride.

Alkali-soluble resin (A2) composition: A composition (solid content: 70 mass %, solvent naphtha: 30 mass %) of a resin (alkali-soluble resin (A2), acid value: 98 mgKOH/g) obtained by purifying with hexane a resin having acryloyl groups and carboxy groups introduced by reacting a bisphenol A-type epoxy resin with acrylic acid and then with 1,2,3,6-tetrahydrophthalic anhydride.

Alkali-soluble resin (A3) composition: A composition (solid content: 55 mass %, PGMEA: 45 mass %) of a resin (alkali-soluble resin (A3), acid value: 60 mgKOH/g) obtained by purifying with hexane a resin having acryloyl groups and carboxy groups introduced by reacting a fluorene-type epoxy resin with acrylic acid and then with 1,2,3,6-tetrahydro phthalic anhydride.
(Photopolymerization Initiator (B))

IR907 (tradename): IRGACURE 907, 2-methyl-1-[4-(methylthio)phenyl]-2-morpholinopropan-1-one (manufactured by BASF)

OXE02 (tradename): IRGACURE OXE 02, ethanone 1-[9-ethyl-6-(2-methylbenzoyl)-9H-carbazol-3-yl]-1-(O-acetyloxime) (manufactured by BASF)

IR819 (tradename): IRGACURE 819, bis(2,4,6-trimethylbenzoyl)-phenylphosphine oxide (manufactured by BASF)

IR369 (tradename): IRGACURE 369, 2-benzyl-2-dimethylamino-1-(4-morpholinophenyl)-butan-1-one (manufactured by BASF)

EAB: 4,4'-bis(diethylamino)benzophenone (manufactured by Tokyo Chemical Industry Co., Ltd)
(Thiol Compound (C))

Thiol compound (C–1): Karenz MT NR1 (tradename, manufactured by SHOWA DENKO K.K., 1,3,5-tris(3-mercaptobutyloxyethyl)-1,3,5-triazine-2,4,6(1H,3H,5H)-trione, molecular weight: 567.7, SH equivalent: 189.2, number of mercapto groups in one molecule: 3)

Thiol compound (C-2): Karenz MT PE1 (tradename, manufactured by SHOWA DENKO K.K., pentaerythritol tetrakis(3-mercaptobutyrate), molecular weight: 544.8, SH equivalent: 136.2, number of mercapto groups in one molecule: 4)

Thiol compound (C-3): TEMB (tradename, manufactured by SHOWA DENKO K.K., trimethylolethane tris(3-mercaptobutyrate), molecular weight: 426.61, SH equivalent: 142.2, number of mercapto groups in one molecule: 3)

Thiol compound (C-4): 2,4,6-trimercapto-S-triazine (manufactured by SANKYO KASEI Co., Ltd., molecular weight: 177.27, SH equivalent: 59.1, number of mercapto groups in one molecule: 3)
(Thiol Compound (Cf) (Compound Having at Most 2 Mercapto Groups in One Molecule Used for Comparison)

Thiol compound (Cf-1): 2-mercaptobenzoxazole (molecular weight: 151.2, SH equivalent: 151.2, number of mercapto groups in one molecule: 1)

Thiol compound (Cf-2): Karenz MT BD1 (tradename, manufactured by SHOWA DENKO K.K., 1,4-bis(3-mercaptobutyryloxy)butane, molecular weight: 294.4, SH equivalent: 147.2, number of mercapto groups in one molecule: 2)
(Raw Materials for Ink Repellent Agent (D1))

Compound (dx-11) corresponding to compound (dx-1): $F(CF_2)_6CH_2CH_2Si(OCH_3)_3$ (produced by a known method).

Compound (dx-12) corresponding to compound (dx-1): $F(CF_2)_8CH_2CH_2Si(OCH_3)_3$ (produced by a known method).

Compound (dx-13) corresponding to compound (dx-1): $F(CF_2)_4CH_2CH_2Si(OCH_3)_3$ (produced by a known method).

Compound (dx-21) corresponding to compound (dx-2): $Si(OC_2H_5)_4$ (manufactured by Colcoat Co., Ltd.)

Compound (dx-31) corresponding to compound (dx-3): $CH_2=CHCOO(CH_2)_3Si(OCH_3)_3$ (manufactured by Tokyo Chemical Industry Co., Ltd.).

Compound (dx-41) corresponding to compound (dx-4): $(CH_3)_3$—Si—$OCH_3$ (manufactured by Tokyo Chemical Industry Co., Ltd.).

Compound (dx-42) corresponding to compound (dx-4): Ph-Si—$(OC_2H_5)_3$ (in the formula, Ph is a phenyl group, tradename: KBE-103, manufactured by Shin-Etsu Chemical Co., Ltd.).

Compound (dx-43) corresponding to compound (dx-4): $C_{10}H_{21}$—Si—$(OCH_3)_3$ (tradename: KBM-3103C, manufactured by Shin-Etsu Chemical Co., Ltd.).

Compound (dx-51) corresponding to compound (dx-5): HS—$(CH_2)_3$—$Si(OCH_3)_3$ (tradename: KBM-803, manufactured by Shin-Etsu Chemical Co., Ltd.).
(Raw Materials for Ink Repellent Agent (D2))

C6FMA: $CH_2=C(CH_3)COOCH_2CH_2(CF_2)_6F$

C4α-Cl acrylate: $CH_2=C(Cl)COOCH_2CH_2(CF_2)_4F$

MAA: methacrylic acid

2-HEMA: 2-hydroxyethyl methacrylate

IBMA: isobornyl methacrylate

V-65: manufactured by Wako Pure Chemical Industries Ltd., 2,2'-azobis(2,4-dimethylvaleronitrile)

n-DM: n-dodecylmercaptan

BEI: Karenz BEI (tradename, manufactured by SHOWA DENKO K.K., 1,1-(bisacryloyloxymethyl)ethyl isocyanate)

AOI: Karenz AOI (tradename, manufactured by SHOWA DENKO K.K., 2-acryloyloxyethyl isocyanate)

DBTDL: dibutyltin dilaurate

TBQ: t-butyl-p-benzoquinone

MEK: 2-butanone
(Cross-Linking Agent (E))

A9530 (tradename): NK Ester A-9530 (manufactured by Shin-Nakamura Chemical Co., Ltd.), mixed product of dipentaerythritol hexaacrylate and dipentaerythritol pentaacrylate.

A9550 (tradename): NK Ester A-9550 (manufactured by Shin-Nakamura Chemical Co., Ltd.), mixed product of dipentaerythritol hexaacrylate and dipentaerythritol pentaacrylate.

A9300 (tradename): NK Ester A-9300 (manufactured by Shin-Nakamura Chemical Co., Ltd.), tris(2-acryloxyethyl) isocyanurate.
(Solvent (F))

PGMEA: Propylene glycol monomethyl ether acetate.

PGME: Propylene glycol monomethyl ether.

EDM: Diethylene glycol ethylmethyl ether.

IPA: 2-Propanol.
(Alkali Catalyst)

TMAH: Tetramethylammonium hydroxide
[Synthesis of Ink Repellent Agent (D)]

Ink repellent agent (D1) and ink repellent agent (D2) were synthesized or prepared as follows.

Synthesis Example 1

Synthesis of Ink Repellent Agent (D1-1)

Into a 1,000 cm$^3$ three necked flask equipped with a stirrer, 15 g of compound (dx-11), 20 g of compound (dx-21) and 27 g of compound (dx-31) were put to obtain a mixture of hydrolysable silane compounds. Then, to this mixture, 284.3 g of PGME was added to obtain a raw material solution.

To the obtained raw material solution, 30 g of a 1 mass % hydrochloric acid aqueous solution was dropwise added. After completion of the dropwise addition, stirring was conducted at 40° C. for 5 hours to obtain a PGME solution of ink repellent agent (D1-1) (concentration of ink repellent agent (D1-1): 10 mass %, hereinafter referred to also as "ink repellent agent (D1-1) solution").

Further, after completion of the reaction, components of the reaction solution were measured by gas chromatography to confirm that the respective compounds as raw materials became lower than the detective limit.

Charged amounts of raw material hydrolysable silane compounds, etc. used for the production of the obtained ink repellent agent (D1-1) are shown in Table 2. In Table 2, silane compounds mean hydrolysable silane compounds.

Further, the number average molecular weight (Mn), the mass average molecular weight (Mw), the content of fluorine atoms, the content of C=C and the acid value of the obtained ink repellent agent (D1-1) were measured, and the results are shown in Table 3.

Synthesis Examples 2 to 10

Syntheses of Ink Repellent Agents (D1-2) to (D1-10)

In the same manner as in Synthesis Example 1 except that the raw material composition was changed as shown in Table 2, solutions of ink repellent agents (D1-2) to (D1-10) were respectively obtained (compound concentration in each solution: 10 mass %, hereinafter, the respective solutions may be referred to also as "ink repellent agents (D1-2) to (D1-10) solution").

Charged amounts and molar ratios of raw material hydrolysable silane compounds used for the production of the obtained ink repellent agents (D1-1) to (D1-10) are shown in Table 2. In Table, 2, the silane compound means a hydrolysable silane compound.

Further, the number average molecular weight (Mn), the mass average molecular weight (Mw), the content of fluorine atoms, the content of C=C and the acid value of the obtained ink repellent agent were measured, and the results are shown in Table 3.

Synthesis Example 11

Synthesis of Ink Repellent Agent (D2-1)

Into an autoclave having an internal capacity of 1,000 cm$^3$ and equipped with a stirrer, 415.1 g of MEK, 81.0 g of C6FMA, 18.0 g of MAA, 81.0 g of 2-HEMA, 5.0 g of polymerization initiator V-65 and 4.7 g of n-DM were charged, and while stirring under a nitrogen atmosphere, polymerized at 50° C. for 24 hours, and further heated at 70° C. for hours to inactivate the polymerization initiator to obtain a solution of a copolymer. The copolymer had a number average molecular weight of 5,540 and a mass average molecular weight of 13,200.

Then, into an autoclave having an internal capacity of 300 cm$^3$ and equipped with a stirrer, 130.0 g of the above copolymer solution, 33.5 g of BEI, 0.13 g of DBTDL and 1.5 g of TBQ were charged and while stirring, reacted at 40° C. for 24 hours, to synthesize a crude polymer. To the obtained crude polymer solution, hexane was added for reprecipitation purification, followed by vacuum drying to obtain 65.6 g of ink repellent agent (D2-1).

The number average molecular weight (Mn), the mass average molecular weight (Mw), the content of fluorine atoms, the content of ethylenic double bonds and the acid value of the obtained ink repellent agent (D2-1) are shown in Table 3.

TABLE 2

| | Synthesis Examples | 1 | 2 | 3 | 4 | 5 | 6 | 7 | 8 | 9 | 10 |
|---|---|---|---|---|---|---|---|---|---|---|---|
| | Ink repellent agent (D) | (D1-1) | (D1-2) | (D1-3) | (D1-4) | (D1-5) | (D1-6) | (D1-7) | (D1-8) | (D1-9) | (D1-10) |
| Charged amounts (g) of silane compounds, etc. | Compound (dx-11) | 15 | 10.5 | 15 | 15 | 15 | 0 | 0 | 15 | 15 | 15 |
| | Compound (dx-12) | 0 | 0 | 0 | 0 | 0 | 15 | 0 | 0 | 0 | 0 |
| | Compound (dx-13) | 0 | 0 | 0 | 0 | 0 | 0 | 15 | 0 | 0 | 0 |
| | Compound (dx-21) | 20 | 70.1 | 16.7 | 23.3 | 23.3 | 19.2 | 29.6 | 20 | 16.7 | 23.3 |
| | Compound (dx-31) | 27 | 0 | 18.8 | 17.5 | 17.5 | 14.4 | 22.2 | 27 | 18.8 | 17.5 |
| | Compound (dx-41) | 0 | 0 | 4.2 | 0 | 0 | 0 | 0 | 0 | 4.2 | 0 |
| | Compound (dx-42) | 0 | 0 | 0 | 7.2 | 0 | 0 | 0 | 0 | 0 | 7.2 |
| | Compound (dx-43) | 0 | 0 | 0 | 0 | 7.8 | 6.4 | 9.9 | 0 | 0 | 0 |
| | Compound (dx-51) | 0 | 0 | 2.2 | 0 | 0 | 0 | 0 | 0 | 2.2 | 0 |
| | PGME | 284.3 | 0 | 0 | 262.9 | 281.3 | 255.6 | 321.1 | 284.3 | 0 | 262.9 |
| | PGMEA | 0 | 160 | 0 | 0 | 0 | 0 | 0 | 0 | 0 | 0 |
| | IPA | 0 | 0 | 269.2 | 0 | 0 | 0 | 0 | 0 | 269.2 | 0 |
| | 1 mass % Hydrochloric acid aqueous solution | 30 | 50.9 | 26.7 | 0 | 0 | 0 | 0 | 0 | 0 | 0 |
| | 1 mass % Nitric acid aqueous solution | 0 | 0 | 0 | 30.8 | 30.8 | 25.4 | 39.2 | 0 | 0 | 0 |
| | 1 mass % Sodium hydroxide aqueous solution | 0 | 0 | 0 | 0 | 0 | 0 | 0 | 30 | 26.7 | 0 |
| | 1 mass % TMAH aqueous solution | 0 | 0 | 0 | 0 | 0 | 0 | 0 | 0 | 0 | 30.8 |
| Charged molar ratios of silane compounds | Compound (dx-11) | 0.13 | 0.06 | 0.14 | 0.13 | 0.13 | 0.00 | 0.00 | 0.13 | 0.14 | 0.13 |
| | Compound (dx-12) | 0.00 | 0.00 | 0.00 | 0.00 | 0.00 | 0.13 | 0.00 | 0.00 | 0.00 | 0.00 |
| | Compound (dx-13) | 0.00 | 0.00 | 0.00 | 0.00 | 0.00 | 0.00 | 0.13 | 0.00 | 0.00 | 0.00 |
| | Compound (dx-21) | 0.40 | 0.94 | 0.34 | 0.45 | 0.45 | 0.45 | 0.45 | 0.40 | 0.34 | 0.45 |
| | Compound (dx-31) | 0.47 | 0.00 | 0.34 | 0.30 | 0.30 | 0.30 | 0.30 | 0.47 | 0.34 | 0.30 |
| | Compound (dx-41) | 0.00 | 0.00 | 0.09 | 0.00 | 0.00 | 0.00 | 0.00 | 0.00 | 0.09 | 0.00 |
| | Compound (dx-42) | 0.00 | 0.00 | 0.00 | 0.12 | 0.00 | 0.00 | 0.00 | 0.00 | 0.00 | 0.12 |
| | Compound (dx-43) | 0.00 | 0.00 | 0.00 | 0.00 | 0.12 | 0.12 | 0.12 | 0.00 | 0.00 | 0.00 |
| | Compound (dx-51) | 0.00 | 0.00 | 0.09 | 0.00 | 0.00 | 0.00 | 0.00 | 0.00 | 0.09 | 0.00 |

Preparation of Ink Repellent Agent (D2-2)

As ink repellent agent (D2-2), Megafax RS102 (tradename, manufactured by DIC Corporation, a polymer having repeating units represented by the following formula (C2F), n/m=3 to 4) was prepared.

The number average molecular weight (Mn), the mass average molecular weight (Mw), the content of fluorine atoms, the content of ethylenic double bonds and the acid value of ink repellent agent (D2-2) are shown in Table 3.

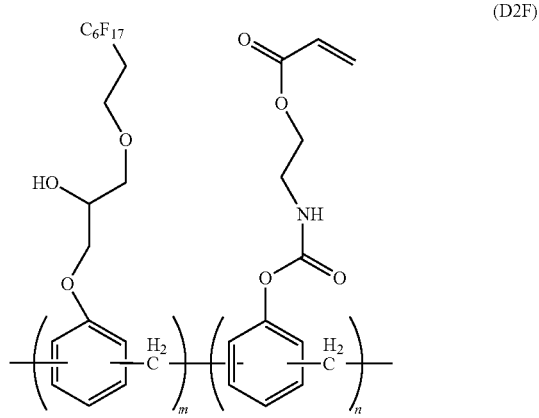

(D2F)

Synthesis Example 12

Synthesis of Ink Repellent Agent (D2-3)

Into an autoclave having an internal capacity of 1,000 cm³ and equipped with a stirrer, 317.5 g of C4α-Cl acrylate, 79.4 g of MAA, 47.7 g of IBMA, 52.94 g of 2-HEMA, 4.6 g of n-DM, 5.0 g of polymerization initiator V-65 and 417.7 g of MEK were put, and while stirring under a nitrogen atmosphere, polymerized at 50° C. for 24 hours, and further heated at 70° C. for 5 hours to inactivate the polymerization initiator to obtain a solution of a copolymer. The copolymer had a number average molecular weight of 5,060 and a mass average molecular weight of 8,720. The solid content concentration was measured and found to be 30 wt %.

Then, into an autoclave having an internal capacity of 300 cm³ and equipped with a stirrer, 130.0 g of the above copolymer solution, 3.6 g of AOI (0.8 equivalent to hydroxy groups in the copolymer, 0.014 g of DBTDL and 0.18 g of TBQ were charged and while stirring, reacted at 40° C. for 24 hours, to synthesize a crude polymer. To the obtained crude polymer solution, hexane was added for reprecipitation purification, followed by vacuum drying to obtain 35.8 g of ink repellent agent (D2-3).

The number average molecular weight (Mn), the mass average molecular weight (Mw), the content of fluorine atoms, the content of ethylenic double bonds and the acid value of the obtained ink repellent agent (D2-3) are shown in Table 3.

TABLE 3

| Synthesis Examples | 1 | 2 | 3 | 4 | 5 | 6 | 7 |
|---|---|---|---|---|---|---|---|
| Ink repellent agent (D) | (D1-1) | (D1-2) | (D1-3) | (D1-4) | (D1-5) | (D1-6) | (D1-7) |
| Mn | 1,200 | 1,330 | 1,050 | 1,030 | 1,040 | 950 | 1,010 |
| Mw | 1,310 | 1,560 | 1,200 | 1,150 | 1,170 | 1,090 | 1,130 |
| Content of fluorine atoms (mass %) | 21.0 | 19.0 | 22.4 | 22.2 | 21.1 | 25.4 | 15.9 |
| Content of C=C (mmol/g) | 3.06 | 0.00 | 2.27 | 2.09 | 1.98 | 1.83 | 2.17 |
| Acid value (mgKOH/g) | — | — | — | — | — | — | — |

| Synthesis Examples | 8 | 9 | 10 | 11 | — | 12 |
|---|---|---|---|---|---|---|
| Ink repellent agent (D) | (D1-8) | (D1-9) | (D1-10) | (D2-1) | (D2-2) | (D2-3) |
| Mn | 1,330 | 1,280 | 1,360 | 7,540 | 5,700 | 8,000 |
| Mw | 1,520 | 1,490 | 1,650 | 16,200 | 8,800 | 10,600 |
| Content of fluorine atoms (mass %) | 21.0 | 22.4 | 22.2 | 14.8 | 19.0 | 28.0 |
| Content of C=C (mmol/g) | 3.06 | 2.27 | 2.09 | 3.73 | 2.86 | 0.60 |
| Acid value (mgKOH/g) | — | — | — | 35.1 | 0 | 93.3 |

Ex. 1

Preparation of Negative Photosensitive Resin Composition, and Production of Cured Film and Partition Walls (Production of Negative Photosensitive Resin Composition)

15.90 g of the alkali-soluble resin (A1) composition, 1.27 g of IR907, 1.11 g of EAB, 0.22 g of the thiol compound (C-1), 1.34 g of the ink repellent agent (D1-2 solution, 11.13 g of A9530 and 69.03 g of PGMEA were put in a 200 cm³ container for stirring, and stirred for 3 hours to produce a negative photosensitive resin composition 1.

(Production of Partition Walls)

A 10 cm square glass substrate was subjected to ultrasonic cleaning with ethanol for 30 seconds and then to UV/O₃ (ultraviolet/ozone) treatment for 5 minutes. For the UV/O₃ treatment, PL2001N-58 (manufactured by Sen Engineering Co., Ltd.) was used as an UV/O₃ generating apparatus. The light power (light output) calculated for 254 nm was 10 mW/cm².

On the surface of the glass substrate after the above cleaning, the negative photosensitive resin composition 1 obtained as described above, was applied by means of a spinner and then, dried on a hot plate at 100° C. for 2 minutes to form a dried film having a film thickness of 2.4 µm. The obtained dried film was subjected to whole surface integrated exposure to UV light of an ultrahigh pressure mercury lamp, of which the exposure power (exposure output) calculated for 365 nm was 25 mW/cm², via a photomask win a masking portion (non-exposed portion) of 2.5×5 cm (exposure amount: 250 mJ/cm²). At the time of exposure, light of 330 nm or less was cut. Here, the spaced distance between the dried film and the photomask was set to be 50 µm.

Then, the glass substrate after the exposure treatment, was immersed in a 2.38 mass % tetramethylammonium hydroxide aqueous solution for 40 seconds for development, followed by rinsing with water to remove non-exposed portions and then by drying. Then, it was heated on a hot plate at 230° C. for 60 minutes to obtain partition walls as a cured film having opening sections corresponding to masking portions of the photomask.

(Production of Cured Film)

On the surface of the same glass substrate as in the production of the partition walls, the negative photosensitive resin composition 1 obtained as described above, was applied by means of a spinner and then, dried on a hot plate at 100° C. for 2 minutes to form a dried film having a film thickness of 2.4 µm. The obtained dried film was subjected to whole surface integrated exposure to UV light of an ultrahigh pressure mercury lamp, of which the exposure power (exposure output) calculated for 365 nm was 25 mW/cm². By such a method, two types of cured films were produced by adjusting the irradiation time so that the exposure amount would be 30 mJ/cm² or 40 mJ/cm². In either case, at the time of exposure, light of 330 nm or less was cut.

Then, the glass substrate after the exposure treatment, was immersed in a 0.02 mass % tetramethylammonium hydroxide aqueous solution for 10 seconds, followed by rinsing with water and then by drying. Then, it was heated on a hot plate at 230° C. for 60 minutes to obtain a cured film having no opening sections.

With respect to the obtained negative photosensitive resin composition 1, partition walls and cured film, the following evaluations were conducted. The evaluation results are shown in Table 4.

(Evaluation)

<Thickness of Partition Walls>

Measured by means of a laser microscope (manufactured by Keyence Corporation, apparatus name: VK-8500).

<Ink Repellency>

The PGMEA contact angle on the upper surface of the partition walls or cured film obtained as described above was measured and adopted as an evaluation for ink repellency.

By a static drop method, in accordance with JIS R3257 "Method for testing wettability of substrate glass surface", PGMEA droplets were placed at three locations on the upper surface of the cured film, and measurements were made with respect to the respective PGMEA droplets. The droplets were about 2 µL/droplet, and the measurements were conducted at 20° C. The contact angle was obtained as an average value of the three measured values.

<Storage Stability of Negative Photosensitive Resin Composition>

The negative photosensitive resin composition 1 was stored at room temperature (from 20 to 25° C.) for 20 days. Then, the state (transparent or turbid) of the negative photosensitive resin composition 1 was visually observed, whereupon partition walls and a cured film (provided that the size of the glass substrate was 7.5 cm square) were produced in the same manner as above. Here, during the production, in the form of a coating film, the presence or absence of a foreign matter on the film surface was observed visually and by a laser microscope.

The outer appearance of the obtained partition walls and cured film and the presence or absence of a foreign matter on the film surface were observed visually and by a laser microscope, whereby they were compared with the partition walls and cured film formed in the same manner as above from the negative photosensitive resin composition 1 before the storage (provided that the size of the glass substrate was changed to 7.5 cm square), and evaluated in accordance with the following standards.

⊚: Even when the coating film is observed visually or by a laser microscope, no foreign matter is ascertained, and the outer appearance is the same as the partition walls and cured film formed from the negative photosensitive resin composition before the storage.

○: When the coating film is observed by a laser microscope, a particulate foreign matter is ascertained.

Δ: When the coating film is visually observed, a particulate foreign matter is ascertained.

x: The negative photosensitive resin composition after the storage gets turbid.

Ex. 2 to 21 and Ex. 31 to 33

A negative photosensitive resin composition was prepared and partition walls and a cured film were produced in the same manner as in Ex. 1 except that the negative photosensitive resin composition was changed to the composition as shown in Table 4, 5 or 6, and the same evaluations as in Ex. 1 were conducted. The evaluation results are shown in Tables 4, 5 and 6 together with the compositions of the negative photosensitive resin compositions.

In Tables 4, 5 and 6, the molar ratio of SH group/C=C in the negative photosensitive resin composition is the molar ratio of mercapto groups per 1 mol of the ethylenic double bonds in the total solid content in the negative photosensitive resin composition.

The ratio of solvent (F) means the ratio of each solvent in the solvent (F).

TABLE 4

| | Components | Compounds·compositions | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Negative photosensitive resin composition [g] | (A) | Alkali-soluble resin (A1) composition | 15.90 | 15.90 | 12.72 | 10.86 | 12.72 | 12.72 | 10.30 | 9.54 |
| | | Alkali-soluble resin (A2) composition | — | — | — | — | — | — | — | — |
| | | Alkali-soluble resin (A3) composition | — | — | — | — | — | — | — | — |
| | (B) | IR907 | 1.27 | 1.27 | 1.02 | 0.87 | 1.02 | 1.02 | 0.82 | 0.76 |
| | | OXE02 | — | — | — | — | — | — | — | — |
| | | IR819 | — | — | — | — | — | — | — | — |
| | | IR369 | — | — | — | — | — | — | — | — |
| | | EAB | 1.11 | 1.11 | 0.89 | 0.76 | 0.89 | 0.89 | 0.72 | 0.67 |
| | (C) or (Cf) | Thiol compound (C-1) | 0.22 | 0.22 | 0.18 | 0.08 | — | 0.18 | 0.14 | 0.13 |
| | | Thiol compound (C-2) | — | — | — | — | 0.18 | — | — | — |
| | | Thiol compound (C-3) | — | — | — | — | — | — | — | — |
| | | Thiol compound (C-4) | — | — | — | — | — | — | — | — |
| | | Thiol compound (Cf-1) | — | — | — | — | — | — | — | — |
| | | Thiol compound (Cf-2) | — | — | — | — | — | — | — | — |
| | (D) | Ink repellent agent (D1-1) solution | — | 1.34 | — | — | 1.07 | — | — | — |
| | | Ink repellent agent (D1-2) solution | 1.34 | — | — | — | — | — | — | — |
| | | Ink repellent agent (D1-3) solution | — | — | 1.07 | 0.91 | — | — | — | — |
| | | Ink repellent agent (D1-4) solution | — | — | — | — | — | — | — | — |
| | | Ink repellent agent (D1-5) solution | — | — | — | — | — | — | — | — |
| | | Ink repellent agent (D1-6) solution | — | — | — | — | — | — | — | — |
| | | Ink repellent agent (D1-7) solution | — | — | — | — | — | — | — | — |
| | | Ink repellent agent (D1-8) solution | — | — | — | — | — | — | — | — |
| | | Ink repellent agent (D1-9) solution | — | — | — | — | — | — | — | — |
| | | Ink repellent agent (D1-10) solution | — | — | — | — | — | — | — | — |
| | | Ink repellent agent (D2-1) | — | — | — | — | — | 0.11 | — | — |
| | | Ink repellent agent (D2-2) | — | — | — | — | — | — | 0.09 | — |
| | | Ink repellent agent (D2-3) | — | — | — | — | — | — | — | 0.08 |
| | (E) | A9530 | 11.13 | 11.13 | 8.90 | 7.60 | 8.90 | 8.90 | 7.21 | 6.68 |
| | | A9550 | — | — | — | — | — | — | — | — |
| | | A9300 | — | — | — | — | — | — | — | — |
| Negative photosensitive resin composition [g] | (F) | PGMEA | 69.03 | — | — | — | 46.22 | 76.18 | 80.71 | 82.14 |
| | | PGME | — | 64.03 | 65.22 | 68.92 | — | — | — | — |
| | | EDM | — | — | — | — | 20.00 | — | — | — |
| | | IPA | — | 2.50 | 5.00 | 5.00 | — | — | — | — |
| | | Water | — | 2.50 | 5.00 | 5.00 | 9.00 | — | — | — |
| Negative photosensitive resin composition [mass %] | Solid content concentration (mass %) | | 25.00 | 25.00 | 20.00 | 17.00 | 20.00 | 20.00 | 16.20 | 15.00 |
| | Ratio in solid content [mass %] | Alkali-soluble resin (A) | 44.52 | 44.52 | 44.52 | 44.72 | 44.52 | 44.74 | 44.74 | 44.74 |
| | | Photopolymerization initiator (B) | 9.53 | 9.53 | 9.53 | 9.57 | 9.53 | 9.57 | 9.57 | 9.57 |
| | | Thiol compound (C) | 0.89 | 0.89 | 0.89 | 0.45 | 0.89 | 0.89 | 0.89 | 0.89 |
| | | Ink repellent agent (D) | 0.53 | 0.53 | 0.53 | 0.54 | 0.53 | 0.05 | 0.05 | 0.05 |
| | | Cross-linking agent (E) | 44.52 | 44.52 | 44.52 | 44.72 | 44.52 | 44.74 | 44.74 | 44.74 |
| | Ratio of solvent (F) [mass %] | Solvent naphtha | 6.5 | 6.5 | 4.8 | 4.0 | 4.8 | 4.8 | 3.7 | 3.4 |
| | | PGMEA | 93.5 | 0.0 | 0.0 | 0.0 | 58.5 | 95.2 | 96.3 | 96.6 |
| | | PGME | 0.0 | 86.8 | 82.5 | 83.9 | 0.0 | 0.0 | 0.0 | 0.0 |
| | | EDM | 0.0 | 0.0 | 0.0 | 0.0 | 25.3 | 0.0 | 0.0 | 0.0 |
| | | IPA | 0.0 | 3.4 | 6.3 | 6.1 | 0.0 | 0.0 | 0.0 | 0.0 |
| | | Water | 0.0 | 3.4 | 6.3 | 6.1 | 11.4 | 0.0 | 0.0 | 0.0 |
| SH group/C=C in negative photosensitive resin composition [molar ratio] × $10^{-2}$ | | | 1.04 | 1.04 | 1.04 | 0.52 | 1.45 | 1.04 | 1.04 | 1.04 |
| Evaluations | Cured film-partition walls | Thickness of partition walls [μm] | 2.0 | 2.0 | 2.0 | 2.0 | 2.0 | 2.0 | 2.0 | 2.0 |
| | | Ink repellency (PGMEA contact angle) [°] Partition walls: exposure amount 250 mJ/cm$^2$ | 43 | 46 | 50 | 50 | 48 | 50 | 49 | 51 |
| | | Cured film: exposure amount 40 mJ/cm$^2$ | 40 | 45 | 49 | 50 | 45 | 48 | 47 | 49 |
| | | Cured film: exposure amount 30 mJ/cm$^2$ | 21 | 43 | 49 | 21 | 44 | 45 | 40 | 35 |
| | Negative photosensitive resin composition | Storage stability (20 days) | ◎ | ◎ | ◎ | ◎ | ○ | ◎ | ◎ | ◎ |

TABLE 5

| | Components | Compounds·compositions | Ex. 9 | Ex. 10 | Ex. 11 | Ex. 12 | Ex. 13 | Ex. 14 | Ex. 15 | Ex. 16 |
|---|---|---|---|---|---|---|---|---|---|---|
| Negative photosensitive resin composition [g] | (A) | Alkali-soluble resin (A1) composition | 12.72 | 12.72 | 12.72 | 12.72 | — | — | 15.71 | 15.71 |
| | | Alkali-soluble resin (A2) composition | — | — | — | — | 13.86 | — | — | — |
| | | Alkali-soluble resin (A3) composition | — | — | — | — | — | 15.02 | — | — |
| | (B) | IR907 | 1.02 | 1.02 | 1.02 | 1.02 | 0.92 | 1.00 | 1.05 | 1.05 |
| | | OXE02 | — | — | — | — | — | — | — | — |
| | | IR819 | — | — | — | — | — | — | — | — |
| | | IR369 | — | — | — | — | — | — | — | — |
| | | EAB | 0.89 | 0.89 | 0.89 | 0.89 | 0.81 | 0.88 | 0.92 | 0.92 |

TABLE 5-continued

| | Components | Compounds·compositions | Ex. 9 | Ex. 10 | Ex. 11 | Ex. 12 | Ex. 13 | Ex. 14 | Ex. 15 | Ex. 16 |
|---|---|---|---|---|---|---|---|---|---|---|
| | (C) or (Cf) | Thiol compound (C-1) | 0.18 | 0.18 | 0.18 | 0.18 | 1.62 | 1.75 | 1.83 | 1.83 |
| | | Thiol compound (C-2) | — | — | — | — | — | — | — | — |
| | | Thiol compound (C-3) | — | — | — | — | — | — | — | — |
| | | Thiol compound (C-4) | — | — | — | — | — | — | — | — |
| | | Thiol compound (Cf-1) | — | — | — | — | — | — | — | — |
| | | Thiol compound (Cf-2) | — | — | — | — | — | — | — | — |
| | (D) | Ink repellent agent (D1-1) solution | — | — | — | — | — | — | — | 1.10 |
| | | Ink repellent agent (D1-2) solution | — | — | — | — | — | — | — | — |
| | | Ink repellent agent (D1-3) solution | — | — | — | — | 0.97 | — | — | — |
| | | Ink repellent agent (D1-4) solution | 1.07 | — | — | — | — | — | — | — |
| | | Ink repellent agent (D1-5) solution | — | 1.07 | — | — | — | — | — | — |
| | | Ink repellent agent (D1-6) solution | — | — | 1.07 | — | — | — | — | — |
| | | Ink repellent agent (D1-7) solution | — | — | — | 1.07 | — | — | — | — |
| | | Ink repellent agent (D1-8) solution | — | — | — | — | — | 1.05 | — | — |
| | | Ink repellent agent (D1-9) solution | — | — | — | — | — | — | 1.10 | — |
| | | Ink repellent agent (D1-10) solution | — | — | — | — | — | — | — | — |
| | | Ink repellent agent (D2-1) | — | — | — | — | — | — | — | — |
| | | Ink repellent agent (D2-2) | — | — | — | — | — | — | — | — |
| | | Ink repellent agent (D2-3) | — | — | — | — | — | — | — | — |
| | (E) | A9530 | 8.90 | 8.90 | 8.90 | 8.90 | — | — | — | 5.50 |
| | | A9550 | — | — | — | — | — | — | — | — |
| | | A9300 | — | — | — | — | 4.85 | 5.26 | 5.50 | — |
| Negative photosensitive resin composition [g] | (F) | PGMEA | — | — | — | — | — | — | — | — |
| | | PGME | 65.22 | 65.22 | 65.22 | 65.22 | 46.97 | 45.05 | 43.90 | 43.90 |
| | | EDM | — | — | — | — | 30.00 | 30.00 | 30.00 | 30.00 |
| | | IPA | 5.00 | 5.00 | 5.00 | 5.00 | — | — | — | — |
| | | Water | 5.00 | 5.00 | 5.00 | 5.00 | — | — | — | — |
| Negative photosensitive resin composition [mass %] | Solid content concentration (mass %) | | 20.00 | 20.00 | 20.00 | 20.00 | 18.00 | 19.50 | 20.40 | 20.40 |
| | Ratio in solid Content [mass %] | Alkali-soluble resin (A) | 44.52 | 44.52 | 44.52 | 44.52 | 53.91 | 53.91 | 53.91 | 53.91 |
| | | Photopolymerization initiator (B) | 9.53 | 9.53 | 9.53 | 9.53 | 9.62 | 9.62 | 9.62 | 9.62 |
| | | Thiol compound (C) | 0.89 | 0.89 | 0.89 | 0.89 | 8.98 | 8.98 | 8.98 | 8.98 |
| | | Ink repellent agent (D) | 0.53 | 0.53 | 0.53 | 0.53 | 0.54 | 0.54 | 0.54 | 0.54 |
| | | Cross-linking agent (E) | 44.52 | 44.52 | 44.52 | 44.52 | 26.95 | 56.95 | 26.95 | 26.95 |
| | Ratio of solvent (F) [mass %] | Solvent naphtha | 4.8 | 4.8 | 4.8 | 4.8 | 5.1 | 5.7 | 6.0 | 6.0 |
| | | PGMEA | 0.0 | 0.0 | 0.0 | 0.0 | 0.0 | 0.0 | 0.0 | 0.0 |
| | | PGME | 82.5 | 82.5 | 82.5 | 82.5 | 57.9 | 56.6 | 55.8 | 55.8 |
| | | EDM | 0.0 | 0.0 | 0.0 | 0.0 | 37.0 | 37.7 | 38.2 | 38.2 |
| | | IPA | 6.3 | 6.3 | 6.3 | 6.3 | 0.0 | 0.0 | 0.0 | 0.0 |
| | | Water | 6.3 | 6.3 | 6.3 | 6.3 | 0.0 | 0.0 | 0.0 | 0.0 |
| SH group/C=C in negative photosensitive resin composition [molar ratio] ×$10^{-2}$ | | | 1.04 | 1.04 | 1.04 | 1.04 | 16.0 | 16.0 | 16.0 | 12.3 |
| Evaluations | Cured film-partition walls | Thickness of partition walls [μm] | 2.0 | 2.0 | 2.0 | 2.0 | 2.0 | 2.0 | 2.0 | 2.0 |
| | | Ink repellency (PGMEA contact angle) [°] Partition walls: exposure amount 250 mJ/cm$^2$ | 46 | 45 | 52 | 43 | 47 | 46 | 47 | 46 |
| | | Cured film: exposure amount 40 mJ/cm$^2$ | 43 | 43 | 47 | 42 | 45 | 45 | 44 | 43 |
| | | Cured film: exposure amount 30 mJ/cm$^2$ | 21 | 22 | 40 | 20 | 44 | 42 | 42 | 40 |
| | Negative photosensitive resin composition | Storage stability (20 days) | ◎ | ◎ | ◎ | ◎ | ◎ | ◎ | ◎ | ◎ |

TABLE 6

| | Components | Compounds·compositions | Ex. 17 | Ex. 18 | Ex. 19 | Ex. 20 | Ex. 21 | Ex. 31 | Ex. 32 | Ex. 33 |
|---|---|---|---|---|---|---|---|---|---|---|
| Negative photosensitive resin composition [g] | (A) | Alkali-soluble resin (A1) composition | — | — | — | — | — | 15.90 | 12.84 | 15.90 |
| | | Alkali-soluble resin (A2) composition | 14.74 | 14.70 | 14.70 | 14.58 | 14.58 | — | — | — |
| | | Alkali-soluble resin (A3) composition | — | — | — | — | — | — | — | — |
| | (B) | IR907 | — | — | — | 1.02 | 1.02 | 1.27 | 1.02 | 1.27 |
| | | OXE02 | 0.98 | — | — | — | — | — | — | — |
| | | IR819 | — | 1.03 | — | — | — | — | — | — |
| | | IR369 | — | — | 1.03 | — | — | — | — | — |
| | | EAB | 0.86 | 0.86 | 0.86 | 1.02 | 1.02 | 1.11 | 0.90 | 1.11 |
| | (C) or (Cf) | Thiol compound (C-1) | 1.72 | 1.72 | 1.72 | — | — | — | — | — |
| | | Thiol compound (C-2) | — | — | — | — | — | — | — | — |
| | | Thiol compound (C-3) | — | — | — | 1.70 | — | — | — | — |
| | | Thiol compound (C-4) | — | — | — | — | 1.70 | — | — | — |
| | | Thiol compound (Cf-1) | — | — | — | — | — | 0.22 | — | — |
| | | Thiol compound (Cf-2) | — | — | — | — | — | — | — | 0.20 |
| | (D) | Ink repellent agent (D1-1) solution | — | — | — | — | — | 1.34 | 1.08 | 1.34 |
| | | Ink repellent agent (D1-2) solution | | | | | | | | |

TABLE 6-continued

| Components | | | Compounds·compositions | Ex. 17 | Ex. 18 | Ex. 19 | Ex. 20 | Ex. 21 | Ex. 31 | Ex. 32 | Ex. 33 |
|---|---|---|---|---|---|---|---|---|---|---|---|
| | | | Ink repellent agent (D1-3) solution | — | — | — | 1.02 | 1.02 | — | — | — |
| | | | Ink repellent agent (D1-4) solution | — | — | — | — | — | — | — | — |
| | | | Ink repellent agent (D1-5) solution | — | — | — | — | — | — | — | — |
| | | | Ink repellent agent (D1-6) solution | — | — | — | — | — | — | — | — |
| | | | Ink repellent agent (D1-7) solution | — | — | — | — | — | — | — | — |
| | | | Ink repellent agent (D1-8) solution | — | — | — | — | — | — | — | — |
| | | | Ink repellent agent (D1-9) solution | — | — | — | — | — | — | — | — |
| | | | Ink repellent agent (D1-10) solution | 1.03 | 1.03 | 1.03 | — | — | — | — | — |
| | | | Ink repellent agent (D2-1) | — | — | — | — | — | — | — | — |
| | | | Ink repellent agent (D2-2) | — | — | — | — | — | — | — | — |
| | | | Ink repellent agent (D2-3) | — | — | — | — | — | — | — | — |
| | (E) | | A9530 | — | — | — | — | 5.95 | 11.13 | 8.98 | 11.13 |
| | | | A9550 | 6.02 | 6.00 | 6.00 | — | — | — | — | — |
| | | | A9300 | — | — | — | 5.95 | — | — | — | — |
| Negative photosensitive resin composition [g] | (F) | | PGMEA | — | — | — | — | — | 0.00 | 0.00 | 55.33 |
| | | | PGME | 44.65 | 44.66 | 44.66 | 44.71 | 44.71 | 56.18 | 65.18 | — |
| | | | EDM | 30.00 | 30.00 | 30.00 | 30.00 | 30.00 | — | — | — |
| | | | IPA | — | — | — | — | — | 12.85 | 5.00 | 13.70 |
| | | | Water | — | — | — | — | — | — | — | — |
| Negative photosensitive resin composition [mass %] | Solid content concentration (mass %) | | | 20.00 | 20.00 | 20.00 | 20.00 | 20.00 | 25.00 | 20.00 | 25.00 |
| | Ratio in solid Content [mass %] | | Alkali-soluble resin (A) | 51.59 | 51.46 | 51.46 | 51.02 | 51.02 | 44.52 | 44.92 | 44.56 |
| | | | Photopolymerization initiator (B) | 9.20 | 9.43 | 9.43 | 10.21 | 10.21 | 9.53 | 9.61 | 9.54 |
| | | | Thiol compound (C) | 8.60 | 8.58 | 8.58 | 8.50 | 8.50 | 0.89 | 0.0 | 0.80 |
| | | | Ink repellent agent (D) | 0.52 | 0.51 | 0.51 | 0.51 | 0.51 | 0.53 | 0.54 | 0.53 |
| | | | Cross-linking agent (E) | 30.09 | 30.02 | 30.02 | 29.76 | 29.76 | 44.52 | 44.92 | 44.56 |
| | Ratio of solvent (F) [mass %] | | Solvent naphtha | 5.6 | 5.6 | 5.6 | 5.5 | 5.5 | 6.5 | 4.9 | 6.5 |
| | | | PGMEA | 0.0 | 0.0 | 0.0 | 0.0 | 0.0 | 0.0 | 0.0 | 75.0 |
| | | | PGME | 56.5 | 56.5 | 56.5 | 56.5 | 56.5 | 76.1 | 82.5 | 0.0 |
| | | | EDM | 37.9 | 37.9 | 37.9 | 37.9 | 37.9 | 0.0 | 0.0 | 0.0 |
| | | | IPA | 0.0 | 0.0 | 0.0 | 0.0 | 0.0 | 17.4 | 6.3 | 18.6 |
| | | | Water | 0.0 | 0.0 | 0.0 | 0.0 | 0.0 | 0.0 | 6.3 | 0.0 |
| SH group/C=C in negative photosensitive resin composition [molar ratio] ×$10^{-2}$ | | | | 12.3 | 12.3 | 12.3 | 19.8 | 39.3 | 1.31 | — | 1.34 |
| Evaluations | Cured film-Partition walls | | Thickness of partition walls [μm] | 2.0 | 2.0 | 2.0 | 2.0 | 2.0 | 2.0 | 2.0 | 2.0 |
| | | Ink repellency (PGMEA contact angle) [°] | Partition walls: exposure amount 250 mJ/cm$^2$ | 47 | 47 | 45 | 49 | 45 | 43 | 46 | 46 |
| | | | Cured film: exposure amount 40 mJ/cm$^2$ | 46 | 45 | 44 | 46 | 43 | <10 | <10 | 25 |
| | | | Cured film: exposure amount 30 mJ/cm$^2$ | 45 | 44 | 42 | 44 | 40 | <10 | <10 | <10 |
| | Negative photosensitive resin composition | | Storage stability (20 days) | ◎ | ◎ | ◎ | ◎ | ◎ | ◎ | ◎ | ◎ |

The negative photosensitive resin compostions of the present invention in Ex. 1 to 21 corresponding to Examples of the present invention, which contained the thiol compound (C) having at least 3 mercapto groups in one molecule, were sufficiently cured even at a low exposure amount, e.g. at an exposure amount of 40 mJ/cm$^2$. Thus, the upper surface of the partition walls and the cured film was excellent in ink repellency.

Thus, in Ex. 1 to 4 and 6 to 21 in which the thiol compound (C-1) having three mercapto groups in one molecule was used, the negative photosensitive resin composition was excellent in the storage stability as compared with Ex. 5 in which the thiol compound (C-2) having 4 mercapto groups in one molecule was used.

Whereas in Ex. 31 to 33 corresponding to Comparative Examples, the thiol compound (Cf-1) or (Cf-2) having one or two mercapto groups in one molecule was used, or no thiol compound was used at all, curing was insufficient at a low exposure amount, e.g. at an exposure amount of 30 mJ/cm$^2$ or 40 mJ/cm$^2$. Thus, the upper surface of the partition walls and the cured film was insufficient in the ink repellency.

[Composition Analysis of Superficial Layer Including Surface of Partition Walls]

The composition of the superficial layer including the surface of the partition walls produced in each of Ex. 16 (Example of the present invention) and Ex. 32 (Comparative Example) in the thickness direction was analyzed by XPS. The apparatus and conditions used for the anyalysis by XPS were as follows.

Apparatus: Quantera-SXM manufactured by Ulvac-Phi, Inc.
X-ray source: Al Kα
X-ray beam size: about 20 μm in diameter
Measurement area: about 20 μm in diameter
Detection angle: 45° from the sample surface
Sputtering ions: Ar
Accelerating voltage for sputtering ions: 1 kV
Raster size of sputtering ions: 3×3 mm$^2$
Measured peaks: F1s, C1s, S2s
No. of Sweeps: 3(F1s), 3(C1s), 32(S2s)
Pass Energy: 224 eV
Step Size: 0.4 eV
Ratio: 2(F1s), 2(C1s), 2(S2s)
Analytical software: MultiPak The abscissa of the profile in thickness direction of the cured resin film obtained by the above XPS analysis represents the sputtering time converted to the distance (thickness) from the surface by the sputtering rate (0.7 nm/min) of a thermally oxidized film (SiO$_2$ film) on a Si wafer determined by the above XPS analysis conditions.

Figure 5:
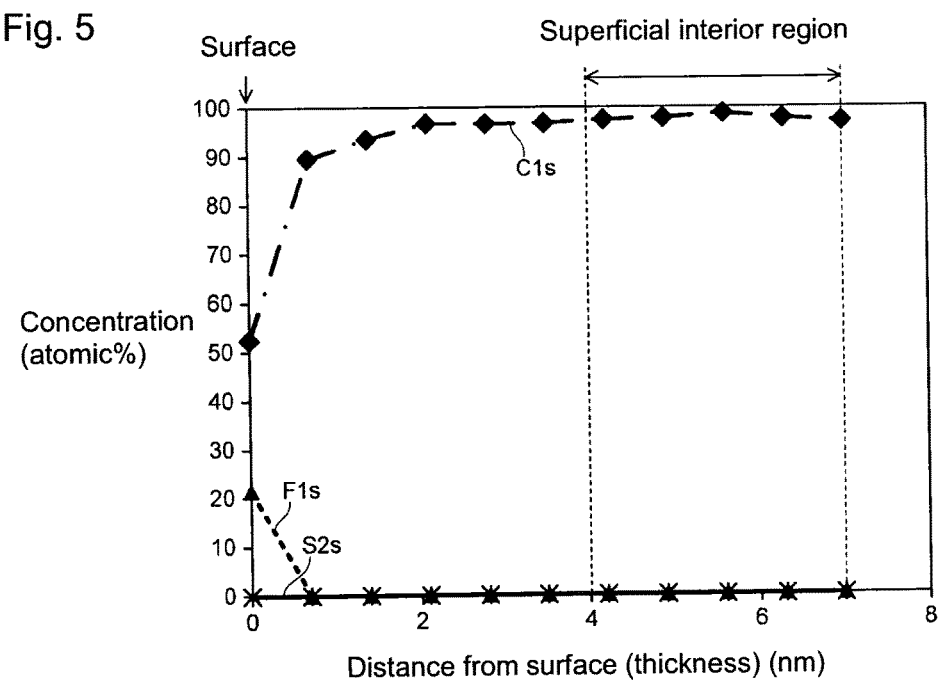
FIG. 5 is a chart showing the results of a composition analysis in the thickness direction of a superficial layer including the surface, by XPS, of a cured resin film in a Comparative Example.

The obtained results of the XPS analysis in Ex. 16 are shown in FIGS. 1 and 2, and the results in Ex. 32 in FIGS. 5 and 6. FIGS. 1 and 2 are as described above.

FIG. 5 illustrates the results of the composition analysis in the thickness direction of the superficial layer including the surface of the partition walls (cured resin film) in Ex. 32 by XPS.

Further, FIG. 6 illustrates the ratios of the concentration of fluorine atoms and the concentration of sulfur atoms to the concentration of carbon atoms in the thickness direction, obtained from the results of analysis of FIG. 5.

With respect to the XPS analysis results of the superficial layer including the surface of the partition walls in Ex. 32, the same items as of the partition walls in Ex. 16 shown in Table 1 are shown in Table 7. That is, the measured values (concentration of atoms) every one minute from the surface (sputtering time: 0 minute) to a sputtering time of 10 minutes of the partition walls, the distance [nm] from the surface as calculated from the sputtering rate of the SiO$_2$ film, the ratio of the concentration of fluorine atoms to the concentration of carbon atoms (represented as [F/C]) and the ratio of the concentration of sulfur atoms to the concentration of carbon atoms (represented as [S/C]) every one minute of the sputtering time calculated from the obtained concentration of carbon atoms, concentration of fluorine atoms and concentration of sulfur atoms, and the average [F/C] and the average [S/C] in the superficial interior region (a distance of from 4 to 7 nm from the surface) are shown.

TABLE 7

| Sputtering time [min] | Distance from surface [nm] | Concentration of atoms [atom %] | | | Ratio | |
|---|---|---|---|---|---|---|
| | | C1s | F1s | S2s | F/C | S/C |
| 0 | 0 | 52.1 | 21.9 | 0.0 | 0.419 | 0.000 |
| 1 | 0.7 | 89.4 | 0.0 | 0.0 | 0.000 | 0.000 |
| 2 | 1.4 | 93.6 | 0.0 | 0.0 | 0.000 | 0.000 |
| 3 | 2.1 | 96.8 | 0.0 | 0.0 | 0.000 | 0.000 |
| 4 | 2.8 | 96.7 | 0.0 | 0.0 | 0.000 | 0.000 |
| 5 | 3.5 | 96.8 | 0.0 | 0.0 | 0.000 | 0.000 |
| 6 | 4.2 | 97.5 | 0.0 | 0.0 | 0.000 | 0.000 |
| 7 | 4.9 | 97.8 | 0.0 | 0.0 | 0.000 | 0.000 |
| 8 | 5.6 | 98.7 | 0.0 | 0.0 | 0.000 | 0.000 |
| 9 | 6.3 | 97.6 | 0.0 | 0.0 | 0.000 | 0.000 |
| 10 | 7 | 97.1 | 0.0 | 0.0 | 0.000 | 0.000 |
| Average in superficial interior region (distance of 4 to 7 nm from surface) | | | | | 0.000 | 0.000 |

In FIG. 6, the ratio of the concentration of fluorine atoms to the concentration of carbon atoms of the partition walls in Ex. 32 in the distance (thickness) direction from the surface obtained from Table 7 is shown by a dotted line, and the ratio of the concentration of sulfur atoms to the concentration of carbon atoms is shown by a solid line.

The above-obtained ratio of the concentration of fluorine atoms to the concentration of carbon atoms ([F/C]$_{(i)}$) and the ratio of the concentration of sulfur atoms to the concentration of carbon atoms ([S/C]$_{(i)}$), at the surface of the partition walls in Ex. 16 (Example of the present invention) and Ex. 32 (Comparative Example), and the average ratio of the concentration of fluorine atoms to the concentration of carbon atoms ([F/C]$_{(ii)}$) and the average ratio of the concentration of sulfur atoms to the concentration of carbon atoms ([S/C]$_{(i)}$) in the superficial interior region, are summarized in Table 8.

TABLE 8

| Position from surface of cured resin film | | Ex. 16 | Ex. 32 |
|---|---|---|---|
| [F/C] | Surface [F/C]$_{(i)}$ | 0.425 | 0.149 |
| | Average [F/C]$_{(ii)}$ in superficial interior region | 0.000 | 0.000 |
| [S/C] | Surface [S/C]$_{(i)}$ | 0.013 | 0.000 |
| | Average [S/C]$_{(ii)}$ in superficial interior region | 0.015 | 0.000 |

The cured resin film of the present invention has the above characteristic (I) with respect to the ratio of the concentration of fluorine atoms to the concentration of carbon atoms in the composition analysis in the thickness direction of the superficial layer including the surface by the above XPS, and has the above characteristic (II) with respect to the ratio of the concentration of sulfur atoms to the concentration of carbon atoms. Thus, partition walls formed of the cured resin film is excellent in the surface liquid repellency and is sufficiently cured even at a low exposure amount.

INDUSTRIAL APPLICABILITY

The negative photosensitive resin composition of the present invention is useful as a composition for e.g. forming partition walls at the time of carrying out pattern printing by an IJ method for optical elements such as an organic EL element, a color filter for a liquid crystal element and an organic TFT array, etc.

The partition walls of the present invention are useful in an organic EL element as partition walls (banks) for pattern printing an organic layer such as a luminescent layer by an IJ method, or in a liquid crystal element as partition walls for pattern printing a color filter by an IJ method (such partition walls may serve also as a black matrix (BM)).

Further, the partition walls of the present invention are useful as e.g. partition walls for pattern printing a conductive pattern or a semiconductor pattern by an IJ method in an organic TFT array, an organic semiconductor layer constituting a channel layer of TFT, a gate electrode, a source electrode, a drain electrode, a gate wiring and a source wiring by an IJ method.

This application is a continuation of PCT Application No. PCT/JP2013/081965 filed on Nov. 27, 2013, which is based upon and claims the benefit of priority from Japanese Patent Application No. 2012-259964 filed on Nov. 28, 2012. The contents of those applications are incorporated herein by reference in their entireties.

REFERENCE SYMBOLS

1: substrate, 21: coating film, 22: dried film, 23: exposed film, 23A: exposed portion, 23B: non-exposed portion, 4: partition wall, 4A: ink repellent layer, 5: opening section, 31: masking portion, 30: photomask, 9: ink jet head, 10: ink, 11: dot, 12: optical element

What is claimed is:

1. A negative photosensitive resin composition comprising:
   an alkali-soluble resin or alkali-soluble monomer (A) having an ethylenic double bond;
   a photopolymerization initiator (B);
   a thiol compound (C) having at least 3 mercapto groups in one molecule; and
   an ink repellent agent (D) which is a compound having an ethylenic double bond.

2. The negative photosensitive resin composition according to claim 1, wherein, in the total solid content in the negative photosensitive resin composition, the content of the alkali-soluble resin or alkali-soluble monomer (A) is from 5 to 80 mass %, the content of the photopolymerization initiator (B) is from 0.1 to 50 mass %, and the content of the ink repellent agent (D) is from 0.01 to 15 mass %.

3. The negative photosensitive resin composition according to claim 1, wherein the negative photosensitive resin composition comprises the thiol compound (C) so that the amount of the mercapto groups in the thiol compound (C) is from 0.0001 to 1 mol per 1 mol of the ethylenic double bond in the total solid content in the negative photosensitive resin composition.

4. The negative photosensitive resin composition according to claim 1, wherein the ink repellent agent (D) has fluorine atoms, and the content of fluorine atoms in the ink repellent agent (D) is from 1 to 40 mass %.

5. The negative photosensitive resin composition according to claim 1, further comprising a cross-linking agent (E) having at least 2 ethylenic double bonds in one molecule and having no acidic group.

6. The negative photosensitive resin composition according to claim 1, further comprising a solvent (F).

7. A cured resin film formed from the negative photosensitive resin composition as defined in claim 1.

8. The cured resin film according to claim 7, wherein the cured resin film is formed on a substrate and
in a composition analysis in the thickness direction of the cured resin film by X-ray photoelectron spectroscopy (XPS) using Ar sputtering ions,
the ratio of the concentration of fluorine atoms to the concentration of carbon atoms at the surface of the cured resin film is from 0.100 to 3.000, and higher than the average ratio of the concentration of fluorine atoms to the concentration of carbon atoms in a superficial interior region beginning at a position of thickness of 4 nm from the surface of the cured resin film and extending to a position of thickness of 7 nm from the surface,
the ratio of the concentration of sulfur atoms to the concentration of carbon atoms at the surface of the cured resin film is from 0.001 to 0.050, and
the average ratio of the concentration of sulfur atoms to the concentration of carbon atoms in the superficial interior region of the cured resin film is from 0.001 to 0.050.

9. Partition walls, which are made of the cured resin film as defined in claim 7, wherein the partition walls are formed such that a substrate surface is partitioned into a plurality of compartments.

10. An optical element comprising the partition walls as defined in claim 9, wherein the partition walls are located between a plurality of dots.

11. The optical element according to claim 10, wherein the dots are formed by an ink jet method.

12. A negative photosensitive resin composition comprising:
an alkali-soluble resin or alkali-soluble monomer (A) having an ethylenic double bond;
a photopolymerization initiator (B);
a thiol compound (C) having at least 3 mercapto groups in one molecule; and
an ink repellent agent (D), which is a partially hydrolyzed condensate of a hydrolysable silane compound.

13. The negative photosensitive resin composition according to claim 12, wherein the partially hydrolyzed condensate is a partially hydrolyzed condensate of a hydrolysable silane compound mixture comprising a hydrolysable silane compound (s1) having a fluoroalkylene group and/or a fluoroalkyl group and having a hydrolysable group.

14. The negative photosensitive resin composition according to claim 13, wherein the hydrolysable silane compound mixture further comprises a hydrolysable silane compound (s2) having 4 hydrolysable groups bonded to the silicon atom.

15. The negative photosensitive resin composition according to claim 14, wherein the hydrolysable silane compound mixture further comprises a hydrolysable silane compound (s3) having a group with an ethylenic double bond and a hydrolysable group and having no fluorine atom.

16. The negative photosensitive resin composition according to claim 12, wherein, in the total solid content in the negative photosensitive resin composition, the content of the alkali-soluble resin or alkali-soluble monomer (A) is from 5 to 80 mass %, the content of the photopolymerization initiator (B) is from 0.1 to 50 mass %, and the content of the ink repellent agent (D) is from 0.01 to 15 mass %.

17. The negative photosensitive resin composition according to claim 12, wherein the negative photosensitive resin composition comprises the thiol compound (C) so that the amount of the mercapto groups in the thiol compound (C) is from 0.0001 to 1 mol per 1 mol of the ethylenic double bond in the total solid content in the negative photosensitive resin composition.

18. The negative photosensitive resin composition according to claim 12, wherein the ink repellent agent (D) has fluorine atoms, and the content of fluorine atoms in the ink repellent agent (D) is from 1 to 40 mass %.

19. A cured resin film formed from the negative photosensitive resin composition as defined in claim 12.

20. The cured resin film according to claim 19, wherein the cured resin film is formed on a substrate and
in a composition analysis in the thickness direction of the cured resin film by X-ray photoelectron spectroscopy (XPS) using Ar sputtering ions,
the ratio of the concentration of fluorine atoms to the concentration of carbon atoms at the surface of the cured resin film is from 0.100 to 3.000, and higher than the average ratio of the concentration of fluorine atoms to the concentration of carbon atoms in a superficial interior region beginning at a position of thickness of 4 nm from the surface of the cured resin film and extending to a position of thickness of 7 nm from the surface, and
the ratio of the concentration of sulfur atoms to the concentration of carbon atoms at the surface of the cured resin film is from 0.001 to 0.050, and
the average ratio of the concentration of sulfur atoms to the concentration of carbon atoms in the superficial interior region of the cured resin film is from 0.001 to 0.050.

* * * * *